(12) United States Patent
Kuenemund

(10) Patent No.: US 11,437,330 B2
(45) Date of Patent: Sep. 6, 2022

(54) PHYSICALLY OBFUSCATED CIRCUIT

(71) Applicant: Infineon Technologies AG, Neubiberg (DE)

(72) Inventor: Thomas Kuenemund, Munich (DE)

(73) Assignee: INFINEON TECHNOLOGIES AG, Neubiberg (DE)

(*) Notice: Subject to any disclaimer, the term of this patent is extended or adjusted under 35 U.S.C. 154(b) by 59 days.

(21) Appl. No.: 17/004,036

(22) Filed: Aug. 27, 2020

(65) Prior Publication Data
US 2021/0066216 A1 Mar. 4, 2021

(30) Foreign Application Priority Data

Sep. 3, 2019 (DE) .................. 102019123555.3

(51) Int. Cl.
H01L 23/00 (2006.01)
H01L 27/092 (2006.01)

(52) U.S. Cl.
CPC .......... H01L 23/576 (2013.01); H01L 27/092 (2013.01)

(58) Field of Classification Search
None
See application file for complete search history.

(56) References Cited

U.S. PATENT DOCUMENTS

| 3,849,673 | A | 11/1974 | Koo |
| 4,506,165 | A | 3/1985 | Gulati et al. |
| 5,159,260 | A | 10/1992 | Yoh et al. |
| 5,689,471 | A | 11/1997 | Voss et al. |
| 5,982,211 | A | 11/1999 | Ko |
| 6,005,797 | A | 12/1999 | Porter et al. |
| 6,133,754 | A | 10/2000 | Olson |
| 6,621,318 | B1 | 9/2003 | Burr |
| 7,084,683 | B1 | 8/2006 | Nix |
| 7,249,109 | B1 | 7/2007 | Silverbrook et al. |
| 7,916,517 | B2 | 3/2011 | Kuenemund |
| 8,111,089 | B2 | 2/2012 | Cocchi et al. |

(Continued)

FOREIGN PATENT DOCUMENTS

| CN | 1307748 A | 8/2001 |
| CN | 1362743 A | 8/2002 |

(Continued)

OTHER PUBLICATIONS

Guajardo, J., "FPGA Intrinsic PUFs and Their Use for IP Protection", Cryptographic Hardware and Embedded Systems—CHES 2007, Sep. 2007, 18 pages, 9th International Workshop, Vienna, Austria.

(Continued)

Primary Examiner — Cassandra F Cox
(74) Attorney, Agent, or Firm — Viering, Jentschura & Partner mbB

(57) ABSTRACT

A physically obfuscated circuit (POC) circuit including a plurality of subcircuits, each comprising at least one p-channel field effect transistor (FET) and at least one n-channel FET, connected such that the at least one n-channel FET, if supplied with an upper supply potential at its gate, supplies a lower supply potential to the gate of the at least one p-channel FET and the at least one p-channel FET, if supplied with the lower supply potential at its gate, supplies the upper supply potential to the gate of the at least one n-channel FET.

19 Claims, 14 Drawing Sheets

(56) References Cited

U.S. PATENT DOCUMENTS

| | | |
|---|---|---|
| 8,362,807 B2 | 1/2013 | Upputuri et al. |
| 8,434,046 B2 | 4/2013 | Marinet |
| 8,710,889 B1 | 4/2014 | Chromczak |
| 9,070,439 B2 | 6/2015 | Gammel et al. |
| 9,496,872 B1 | 11/2016 | Kuenemund |
| 10,347,630 B2 | 7/2019 | Kuenemund |
| 2002/0036577 A1 | 3/2002 | Volk |
| 2002/0080663 A1 | 6/2002 | Kameyama et al. |
| 2004/0108873 A1 | 6/2004 | Tierno et al. |
| 2004/0150052 A1 | 8/2004 | Riccardi et al. |
| 2004/0196082 A1 | 10/2004 | Pacha et al. |
| 2005/0093597 A1 | 5/2005 | Kwak |
| 2006/0038582 A1 | 2/2006 | Peeters |
| 2006/0208772 A1 | 9/2006 | Nakano |
| 2007/0081405 A1 | 4/2007 | Yoo et al. |
| 2008/0136483 A1 | 6/2008 | Sanduleanu et al. |
| 2010/0085081 A1 | 4/2010 | Ofuji et al. |
| 2010/0259301 A1 | 10/2010 | Marino et al. |
| 2011/0025393 A1 | 2/2011 | Sommer |
| 2011/0156007 A1 | 6/2011 | Otsuji et al. |
| 2012/0009207 A1 | 1/2012 | Chin et al. |
| 2013/0099320 A1 | 4/2013 | Lee et al. |
| 2013/0320491 A1 | 12/2013 | Thacker, III et al. |
| 2014/0139262 A1 | 5/2014 | Penzes |
| 2014/0327469 A1 | 11/2014 | Pfeiffer et al. |
| 2015/0071434 A1 | 3/2015 | Thacker, III et al. |
| 2015/0294843 A1 | 10/2015 | Chen et al. |
| 2015/0294943 A1 | 10/2015 | Kuenemund et al. |
| 2015/0294944 A1 | 10/2015 | Kuenemund et al. |
| 2015/0303927 A1 | 10/2015 | Kuenemund et al. |
| 2015/0311202 A1 | 10/2015 | Kuenemund |
| 2015/0381351 A1 | 12/2015 | Kuenemund et al. |
| 2016/0337123 A1 | 11/2016 | Seok et al. |
| 2017/0019104 A1 | 1/2017 | Kuenemund |
| 2017/0110418 A1 | 4/2017 | Kuenemund et al. |
| 2019/0140643 A1 | 5/2019 | Kuenemund |
| 2021/0280536 A1* | 9/2021 | Kuenemund ......... H01L 23/576 |
| 2021/0385094 A1* | 12/2021 | Yu ................. G06F 7/49968 |

FOREIGN PATENT DOCUMENTS

| | | |
|---|---|---|
| CN | 1510837 A | 7/2004 |
| CN | 1612266 A | 5/2005 |
| CN | 1918795 A | 2/2007 |
| CN | 101501778 A | 8/2009 |
| CN | 102113114 A | 6/2011 |
| CN | 103066021 A | 4/2013 |
| CN | 104978499 A | 10/2015 |
| CN | 105024686 A | 11/2015 |
| CN | 106603066 A | 4/2017 |
| CN | 106357263 B | 5/2019 |
| DE | 102015105417 A1 | 10/2015 |
| DE | 102016113128 A1 | 1/2017 |
| DE | 102016120009 A1 | 4/2017 |
| DE | 102017126217 A1 | 5/2019 |
| EP | 1220450 A2 | 7/2002 |
| EP | 2320344 B1 | 5/2011 |
| KR | 20030026058 A | 3/2003 |
| WO | 2005076478 A1 | 8/2005 |
| WO | 2007038448 A2 | 4/2007 |
| WO | 2018009415 A1 | 1/2018 |

OTHER PUBLICATIONS

Lim, D., "Extracting Secret Keys from Integrated Circuits", IEEE Transactions on Very Large Scale Integration (VLSI) Systems, Apr. 25, 2005, 18 pages, vol. 13, issue 10, IEEE.

German Office Action issued for the corresponding DE application No. 10 2019 123 555.3, dated Jun. 30, 2020, 12 pages (for informational purpose only).

J. Rajendran et al., "Security Analysis of Integrated Circuit Camouflaging", CCS '13: Proceedings of the 2013 ACM SIGSAC Conference on Computer & Communications Security, Nov. 2013, 12 pages, Berlin, Germany.

R. Torrance, "The state-of-the-art in Semiconductor Reverse Engineering at Chipworks", Chipworks, Sep. 9, 2009, 72 pages.

"Circuit Camouflage Technology", SMI IP Protection and Anti-Tamper Technologies, Syphermedia Library,Version 1.9.8j, Mar. 2012, SypherMedia International, 6 pages.

S. Wayne. "Combinational Logic Circuits", Electronics Tutorials, Web, Jun. 9, 2018.

* cited by examiner

PHYSICALLY OBFUSCATED CIRCUIT

CROSS-REFERENCE TO RELATED APPLICATIONS

This application claims priority to German Application DE 10 2019 123 555.3, which was filed on Sep. 3, 2019, the entire contents of which are hereby incorporated fully herein by reference.

TECHNICAL FIELD

The present disclosure relates to physically obfuscated circuits.

BACKGROUND

Piracy and Reverse Engineering (RE) of Integrated Circuits (ICs) is considered as one of the most serious threats to semi-conductor industry, since they may be misused to steal and/or pirate a design: successful attackers can overbuild ICs, or fabricate and sell similar, i.e. "cloned" ICs, they may illegally use or sell the extracted and stolen IP, and reveal competitor's trade secrets, etc. For all these reasons, it is desirable to develop concepts and techniques that thwart IC piracy and Reverse Engineering.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects are described with reference to the following drawings, in which.

DESCRIPTION

Figure 1:
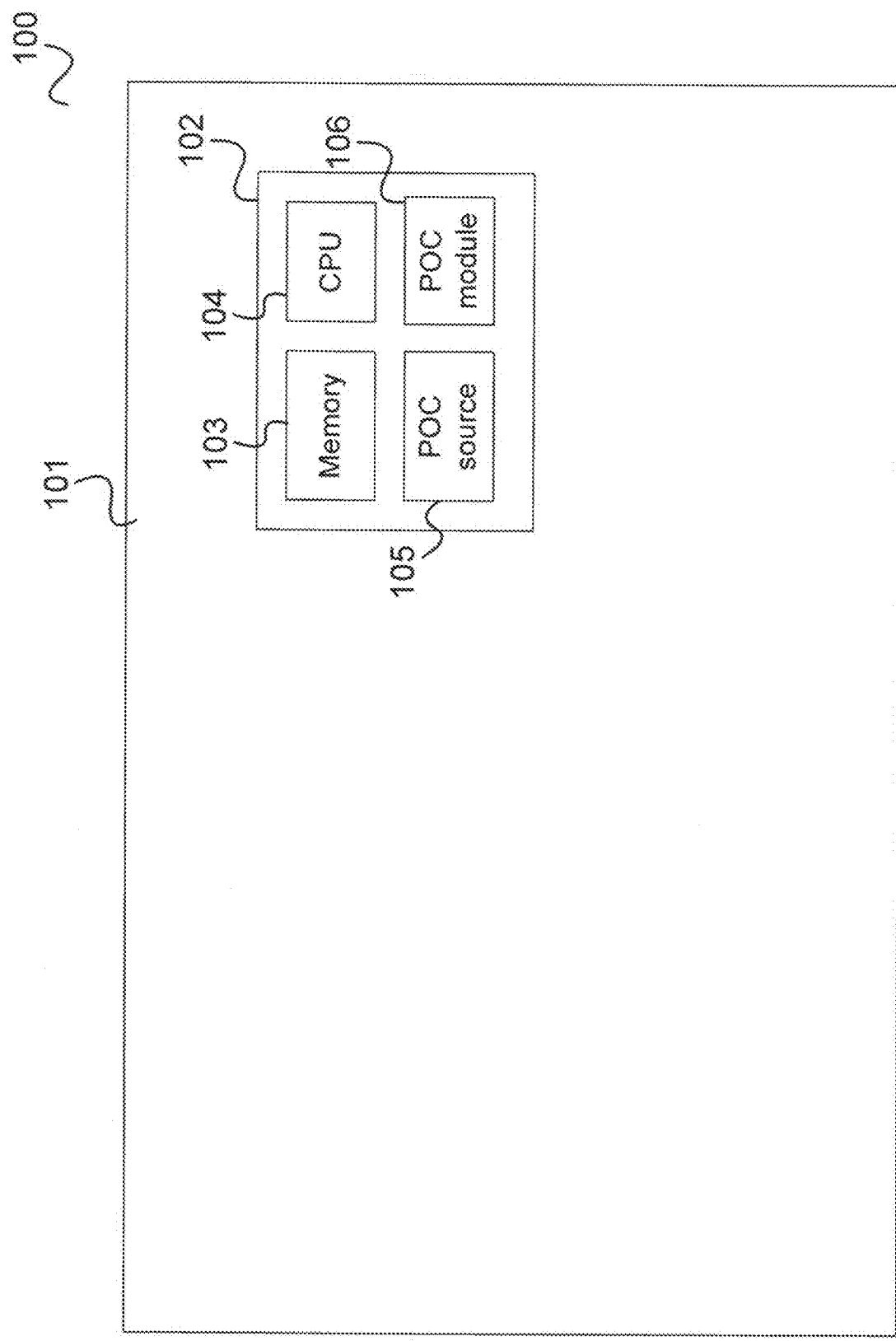
FIG. 1 shows a chip card as an example.

According to various embodiments, a physically obfuscated circuit is provided including a plurality of subcircuits, each subcircuit including at least one p-channel field effect transistor, at least one n-channel field effect transistor, a first power supply terminal configured to receive a first supply voltage with an upper supply potential and a second power supply terminal configured to receive a second supply voltage with a lower supply potential, wherein the at least one p-channel field effect transistor and the at least one n-channel field effect transistor are connected such that the at least one n-channel field effect transistor, if supplied with the upper supply potential at its gate, supplies the lower supply potential to the gate of the at least one p-channel field effect transistor and the at least one p-channel field effect transistor, if supplied with the lower supply potential at its gate, supplies the upper supply potential to the gate of the at least one n-channel field effect transistor and a precharge circuit configured to precharge the subcircuit to a first state in which the potential at the gate of the at least one n-channel field effect transistor is lower than the upper supply potential and the potential at the gate of the at least one p-channel field effect transistor is higher than the lower supply potential and wherein the physically obfuscated circuit further includes a physically obfuscated circuit value bit generation circuit configured to generate at least one physically obfuscated circuit value bit depending on which of the subcircuits first enters a second state in which the potential at the gate of the at least one n-channel field effect transistor is the upper supply potential and the potential at the gate of the at least one p-channel field effect transistor is the lower supply potential.

The following detailed description refers to the accompanying drawings that show, by way of illustration, specific details and aspects of this disclosure in which the invention may be practiced. Other aspects may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

One promising approach for reliable and secure identification and authentication of ICs consists in employing so-called Physical Random Functions or physically obfuscated circuits (POCs) to securely generate on-chip secret keys for cryptographic algorithms. Ideally, silicon POCs generate chip-specific keys that are arbitrarily repeatable but unpredictable and cannot be determined externally. This can be accomplished by leveraging random variations of IC manufacturing processes and at the same time rejecting global process, temperature and supply voltage variations and noise.

Since these POCs may be integrated on-chip together with dedicated control logic, any attempt to physically access the POC circuitry itself can be restricted very effectively and efficiently. This significant resistance to physical attacks is the principal advantage of using controlled silicon POCs.

Moreover, for secret-key generation only weak POCs are required, i.e. POCs that generate POC values for only a limited number of challenge-response pairs (compared to the number of possible challenge-response pairs).

A POC value P can be imagined to be a type of fingerprint of a physical object. By way of the true POC value P, i.e., the POC value at its registration, the physical object can be uniquely identified and a key, for example, can be produced on the basis of the identification. The physical object can be a controller or a microcontroller. It may also be a chip card IC (integrated circuit) of a chip card such as a smart card with any form factor, e.g., for a passport or for a SIM (subscriber identity module).

FIG. 1 shows a chip card 100 as an example.

The chip card 100, which is illustrated here in the card format but may have any form factor, has a carrier 101 and a chip card module 102. The chip card module 102 has various components, such as, e.g., a non-volatile memory 103 and a CPU (central processing unit) 104. In various embodiments, the chip card has a component 105, which serves as a POC source, for example a circuit including a multiplicity of subcircuits, wherein an output of a subcircuit specifies (or is used as a basis for) one or more bits of a POC value. It should be noted that the chip card using a POC is only an example and may be a device including any kind of integrated circuit.

The POC value P can be considered to be an identification number for the chip card 100 (more precisely, for the chip card module 102 in the chip card 100). By way of example, the chip card module 102 has a cryptoprocessor which derives a chip-card-individual cryptographic key from this identification number or the CPU 104 itself derives a cryptographic key therefrom.

For security reasons, neither the true POC value P nor the cryptographic key derived therefrom are stored on the chip card 100. Instead, a so-called POC module 106 is situated on the chip card 100 and connected to the physical object 105. If the POC value P is required (e.g. for key generation), a so-called POC request is then made to the POC module 106, whereupon the POC module 106 determines the POC value anew in each case (by way of an internal electronic operation). Expressed differently, the POC module 106 replies to a POC request with the output of a POC value P', which may differ to a greater or lesser extent from the true POC value P, i.e., the POC value upon registration thereof, depending on the bit stability of the bits supplied by the POC source 105.

There are various approaches to realize controlled silicon-chip-based POCs (i.e., POC sources 105), e.g. SRAM-based, sense-amplifier-based, butterfly-based and latch-based POC fields on the one hand and delay-based POCs such as ring oscillator POCs and arbiter POCs on the other hand.

Approaches like SRAM-POCs (based on the process variation induced tendency of the single bit-cells to assume one of their two stable states at power-up with preference) typically suffer from severe limitations such as poor bit stability and high vulnerability to semi-invasive attacks such as electrical and optical probing, and/or inadequate statistical quality.

As for delay-based POCs, like Ring-Oscillator (RO) and Arbiter POCs (comparing the delays of two ideally identically implemented delay lines), there are similar limitations in terms of bit stability and statistical quality, whereas their known weakness against model building attacks is irrelevant for on-chip cryptographic key generation because the very low number of the controlled silicon POC challenge-response pairs is never directly exposed and cannot be determined externally.

Realizing silicon Arbiter POCs typically leads to relatively poor statistical quality and POC bit stability since, on the one hand, any irregular placement and automated routing of the Arbiter POC's elements result in asymmetric wirings and, as a consequence, in systematic delay skews i.e. in poor statistical quality. On the other hand, the delay differences between the two paths with the same nominal layout length only depend on the small process variations of the involved gates and the wiring making up the competing delay paths, resulting in poor bit stability. This in turn necessitates the generation of so-called helper data during POC enrollment, i.e. along with initial key generation, as well as an expensive (in terms of gate and area count as well as energy dissipation) and time consuming error correction during key reconstruction in the field.

For example, POC bit stability may be enhanced by so-called stable-bit-marking or pre-selection of POC bits (by which unstable bits are discarded in enrollment and no longer considered during reconstruction).

In the following, approaches for realizing a secure and cost efficient POC, e.g. for secret-key generation, are described featuring significantly improved security against physical attacks and exhibiting a reproducibility that is so high that it does not need error correction (which is a considerably expensive measure and typically indispensable for conventional POCs).

These features are achieved by POC circuitry that takes advantage of extremely non-linear electro-thermal deep-sub-threshold relaxation processes from non-equilibrium states towards states of constrained equilibrium.

Figure 2:
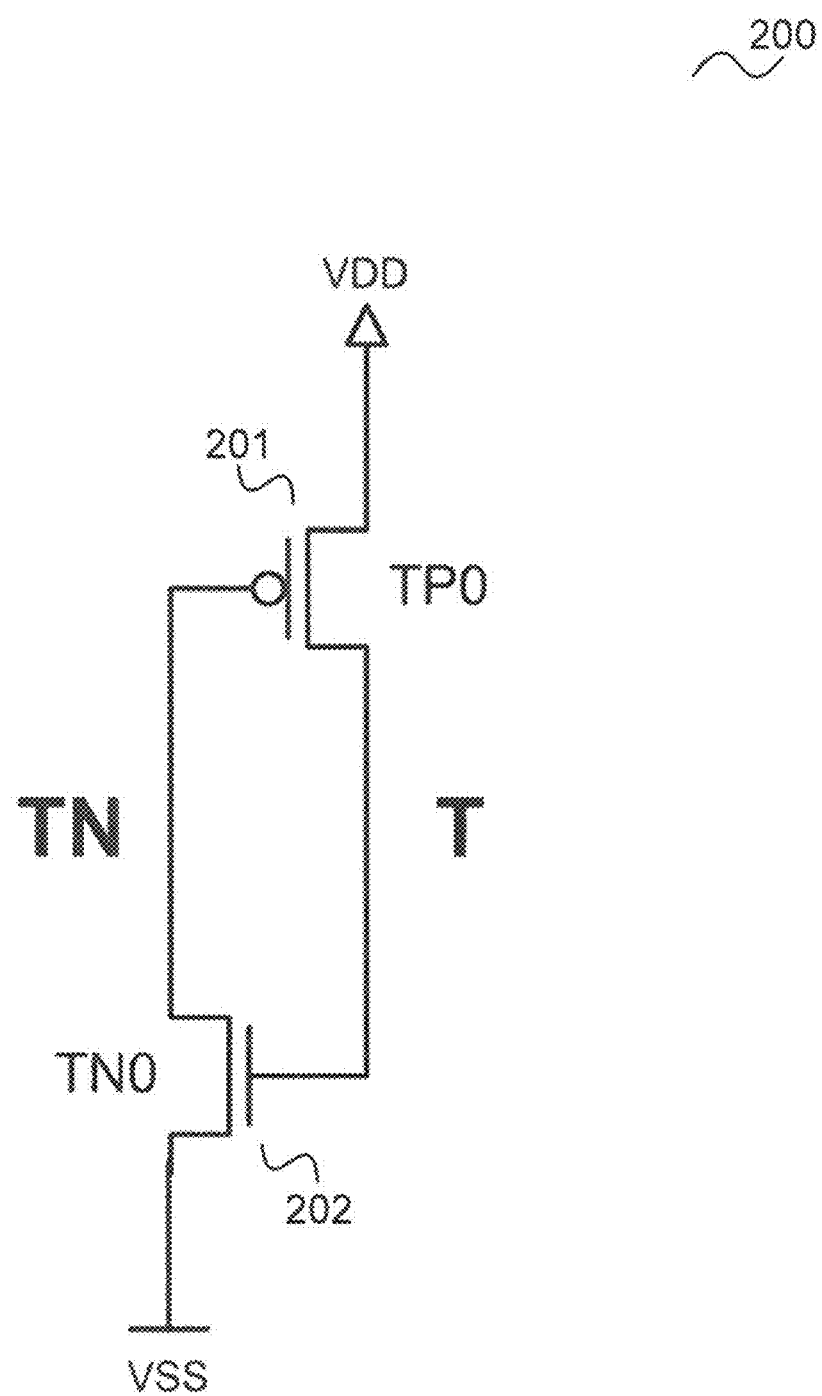
FIG. 2 shows a TIE cell.

Specifically, according to various embodiments, the POC source 105 is based on so-called TIE-cells as illustrated in FIG. 2.

FIG. 2 shows a TIE cell 200.

The TIE cell 200 includes a p-channel field effect transistor (FET) 201 whose source is connected to a high supply potential (VDD), whose gate is connected to the drain of an n-channel field effect transistor 202 and whose drain is connected to the gate of the n-channel field effect transistor 202. The source of the n-channel field effect transistor 202 is connected to a low supply potential (VSS). It should be noted that all FETs mentioned herein may for example be MOSFETs (Metal Oxide Semiconductor Field Effect Transistors) and may be formed in CMOS (Complementary MOS) technology.

The node (or connection) connecting the gate of the p-channel field effect transistor 201 with the drain of the n-channel field effect transistor 202 is in the following referred to as TN and the node (or connection) connecting the gate of the n-channel field effect transistor 202 with the drain of the p-channel field effect transistor 201 is in the following referred to as T. In the following, for simplicity, the state of a node is also denoted with the name to the node, e.g. T is also referred to the state (or signal) at node T.

Let first the case of constrained electro-thermal equilibrium be assumed. It is assumed that the supply potential difference VDD-VSS is high enough so that in steady state equilibrium both FETs 201, 202 operate in strong inversion (i.e. they feature fully developed channel inversion):

$$VDD-VSS > V\text{th}(n\text{-channel } FET\ 202) + |V\text{th}(p\text{-channel } FET\ 201)|$$

where Vth(FET) denotes the threshold voltage of the FET indicated in the parenthesis.

Then, the node voltages' expectation values are the steady state values V(T)=VDD and V(TN)=VSS. That is, even for time variant voltages VDD and VSS, the time-averaged values are the above indicated steady state (and time averaged) values V(T)=VDD and V(TN)=VS S.

Moreover, the circuit's relaxation time ranges from some 100 ps up to the nanosecond regime, depending on process technology, supply voltage, and temperature. That is, the potentials V(T) and V(TN) relax from small perturbations (deviations from their steady state values) to their steady state values VDD and VSS with relaxation times in the (sub-)nano-second regime.

For large deviations of V(T) and V(TN) from their equilibrium values, however, there results a completely different behavior of the TIE-Cell circuit components. In particular consider the extreme case of the initial constraint V(T)=VSS and V(TN)=VDD at time t=0.

That is, the node voltages are first kept at the "inverse" values relative to their above equilibrium values so that initially both FETs 201, 202 are OFF, i.e. they are both in their deep-sub-threshold domain.

If then for t>0 the initial constraint is released (i.e. the nodes T and TN are no longer forced to their initial values), the circuitry 200 finds itself initially in a non-equilibrium state, namely in a state as far as possible away from its above described steady state. As a consequence, the potentials of nodes T and TN will, due to inevitable (deep) sub-threshold currents move in the direction of their equilibrium (steady state) values V(T)=VDD and V(TN)=VSS. This transition is, however, an extremely non-linear one that depends heavily on the VDD voltage level relative to VSS, on the temperature T, and in particular on inevitable manufacturing process variations of the circuit components (here FETs 201, 202), so that two instances (copies) of the "same" TIE cell will with very high probability differ in their relaxation times.

According to various embodiments, two (or more than two, see the examples described below) copies of circuits featuring the above described TIE cell behavior when relaxing from a state far from equilibrium are used for POC circuitry. Such circuits are especially suitable for POC circuitry because of the extremely wide statistical distribution of deep sub-threshold relaxation times due to manufacturing variations.

Figure 3:
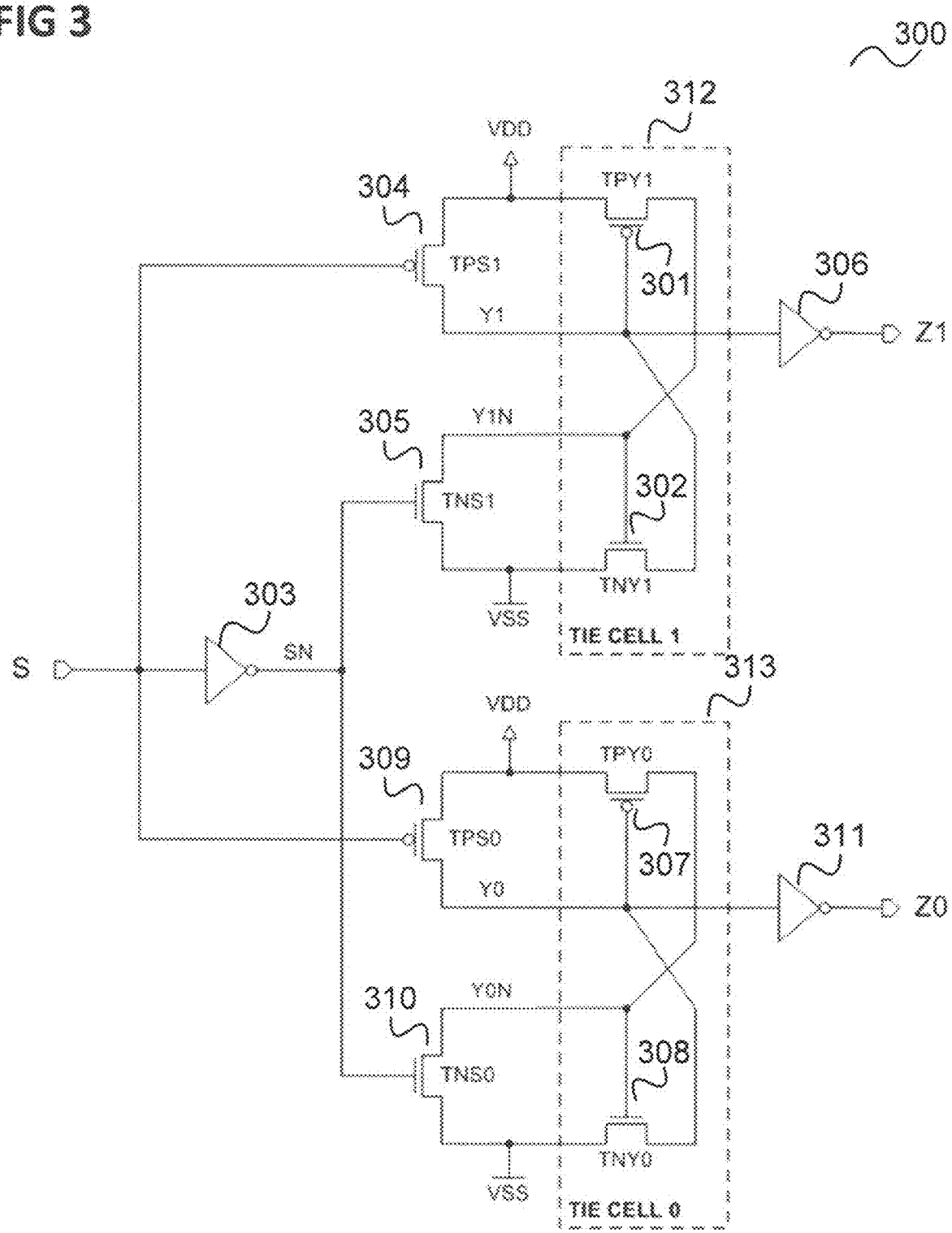
FIG. 3 shows a POC (physically obfuscated circuit) cell having two TIE cells.

Specifically, dedicated circuitry based on the above described deep sub-threshold TIE cell relaxation from non-equilibrium states far away from their steady states is introduced (e.g. as in POC source 105), for example as illustrated in FIG. 3.

FIG. 3 shows a POC cell 300.

Like all POC cells described herein, a multiplicity of POC cells 300 may be included in a circuit configured to generate one or more POC values, e.g. POC source 105.

The POC cell 300 includes a first TIE cell 312 formed by a first p-channel FET 301 and a first n-channel field effect transistor 302. The FETs 301, 302 are cross-coupled and connected to VDD and VSS, respectively, as explained with reference to FIG. 2. However, in addition, the POC cell 300 includes precharge control circuitry for the first TIE cell 312 formed by an inverter 303, a second p-channel FET 304 and a second n-channel FET 305.

The gate of the second p-channel FET 304 receives a control input signal S. The inverter 303 receives the control input signal S and inverts it to an inverted control signal SN which it supplies to the gate of the second n-channel FET 305.

The source of the second p-channel FET 304 is connected to the source of the first p-channel FET 301 and its drain is connected to the gate of the first p-channel FET 301.

The source of the second n-channel FET 305 is connected to the source of the first n-channel FET 302 and its drain is connected to the gate of the first n-channel FET 302.

The gate of the first p-channel FET 301 is further connected to a first output inverter 306 whose output Z1 is one of the outputs of the POC cell 300.

The POC cell 300 further includes a second TIE cell 313 formed by a third p-channel FET 307 and a third n-channel field effect transistor 308. The FETs 307, 308 are cross-coupled and connected to VDD and VSS, respectively, as explained with reference to FIG. 2. However, in addition, the POC cell 300 includes precharge control circuitry for the second TIE cell formed by the inverter 303, a fourth p-channel FET 309 and a fourth n-channel FET 310.

The gate of the fourth p-channel FET 309 receives the control input signal S. The inverted control signal SN is supplied to the gate of the fourth n-channel FET 310.

The source of the fourth p-channel FET 309 is connected to the source of the third p-channel FET 307 and its drain is connected to the gate of the third p-channel FET 307.

The source of the fourth n-channel FET 310 is connected to the source of the third n-channel FET 308 and its drain is connected to the gate of the third n-channel FET 308.

The gate of the third p-channel FET 307 is further connected to a second output inverter 311 whose output Z0 is another one of the outputs of the POC cell 300.

The nodes TN and T of the first TIE cell 312 are referred to as Y1 and Y1N, respectively. The nodes TN and T of the second TIE cell 313 are referred to as Y0 and Y0N, respectively.

The POC cell 300 may be used (e.g. in POC source 105) to generate one bit of a POC value. It may thus also be referred to as POC bit cell. As explained, it has two subcircuits each including a TIE cell 312, 313 and precharge circuitry for enforcing and releasing the non-equilibrium initial condition.

If the control input S is set to 0 (i.e. to VSS level) the precharge circuitry (for the two TIE cells 312, 313) enforces initial TIE cell constraints
V(Y1)=VDD, V(Y1N)=VSS,
V(Y0)=VDD, V(Y0N)=VSS,
since then all precharge transistors 304, 305, 309, 310 for the TIE cell nodes Y1, Y1N and Y0, Y0N are in their respective ON states (where the FETs 304, 305, 309, 310 are in strong inversion).

Figure 4:
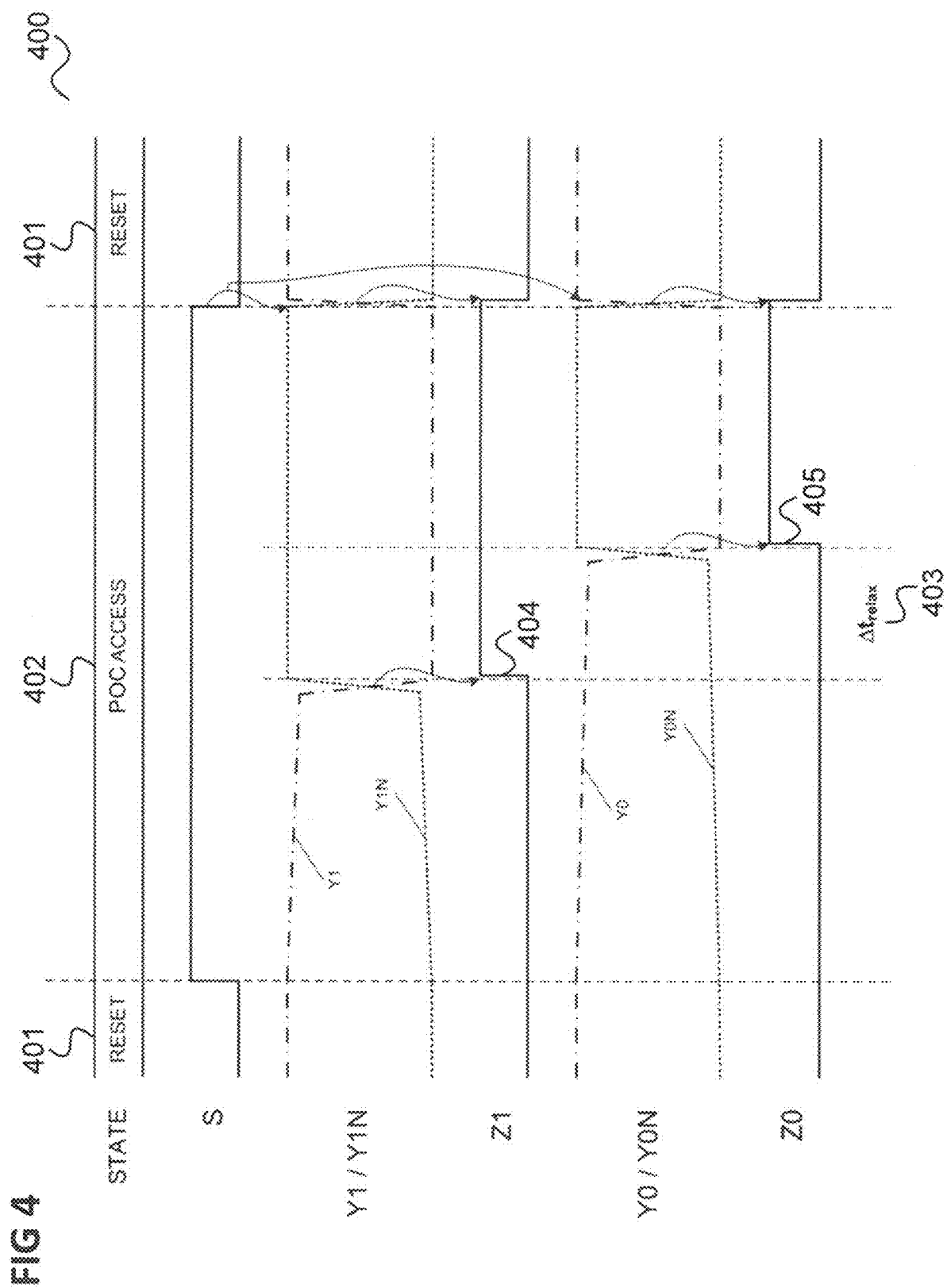
FIG. 4 shows a timing diagram of a precharge and subsequent relaxation (for the POC cell of FIG. 3.

FIG. 4 shows a timing diagram 400 of a precharge and subsequent relaxation (i.e. a precharge and relaxation process sequence) for the POC cell of FIG. 3.

The signals S, Y1, Y1N, Y0, Y0N, Z1, Z0 are shown over time from left to right (wherein in each case, a line further to the top represents a higher potential (e.g. equal or close to VDD) and a line further to the bottom represents a lower potential (e.g. equal or close to VSS).

First, the precharge control circuitry for the two TIE cells 312, 313 enforces initial TIE cell the constraints
V(Y1)=VDD, V(Y1N)=VSS,
V(Y0)=VDD, V(Y0N)=VSS,
This state is referred to as reset state 401 as the initial state. Then, the control input S is set to 1, whereby a POC access state 402 is initiated. After the POC access the signal S is reset to 0, whereby the circuit enters again its reset state 401.

The extremely non-linear relaxation from the deep sub-threshold non-equilibrium state of nodes Y1, Y1N and Y0, Y0N after the constraints have been released with S=1 (i.e. during the POC access phase 402) is illustrated in FIG. 4.

Due to manufacturing variations of the relevant FETs 301, 302 of the first TIE cell 312, as well as FETs 307, 308 of the second TIE cell 313 the electro-thermal relaxations of Y1, Y1N and Y0, Y0N differ usually significantly in their relaxation times (being in the order of some ns up to several µs, depending also heavily on VDD-VSS, and temperature). As a consequence, the output signals Z1 and Z0 switch to 1 at different times.

This is indicated by a time difference 403, denoted as $\Delta_{trelax}$, in FIG. 4, which specifies the difference between the time 404 when the first TIE cell 312 reaches its steady state (Z1 switches to 1) and the time 405 when the second TIE cell 313 reaches its steady state (Z0 switches to 1).

Since the geometrical dimensions (i.e. gate lengths and widths) of the TIE cell components 301, 302, 307, 308 can be chosen to be very small they can be made extremely sensitive to manufacturing process variations. This extreme variation sensitivity of the TIE cells is typically large enough for allowing a very effective so-called stable-bit-marking or adjustable pre-selection of POC bits featuring pre-determined minimum bit stability also with respect to environmental variations (like temperature and supply voltage) as well as to aging.

That can, for instance, be achieved in the following ways.

Figure 5:
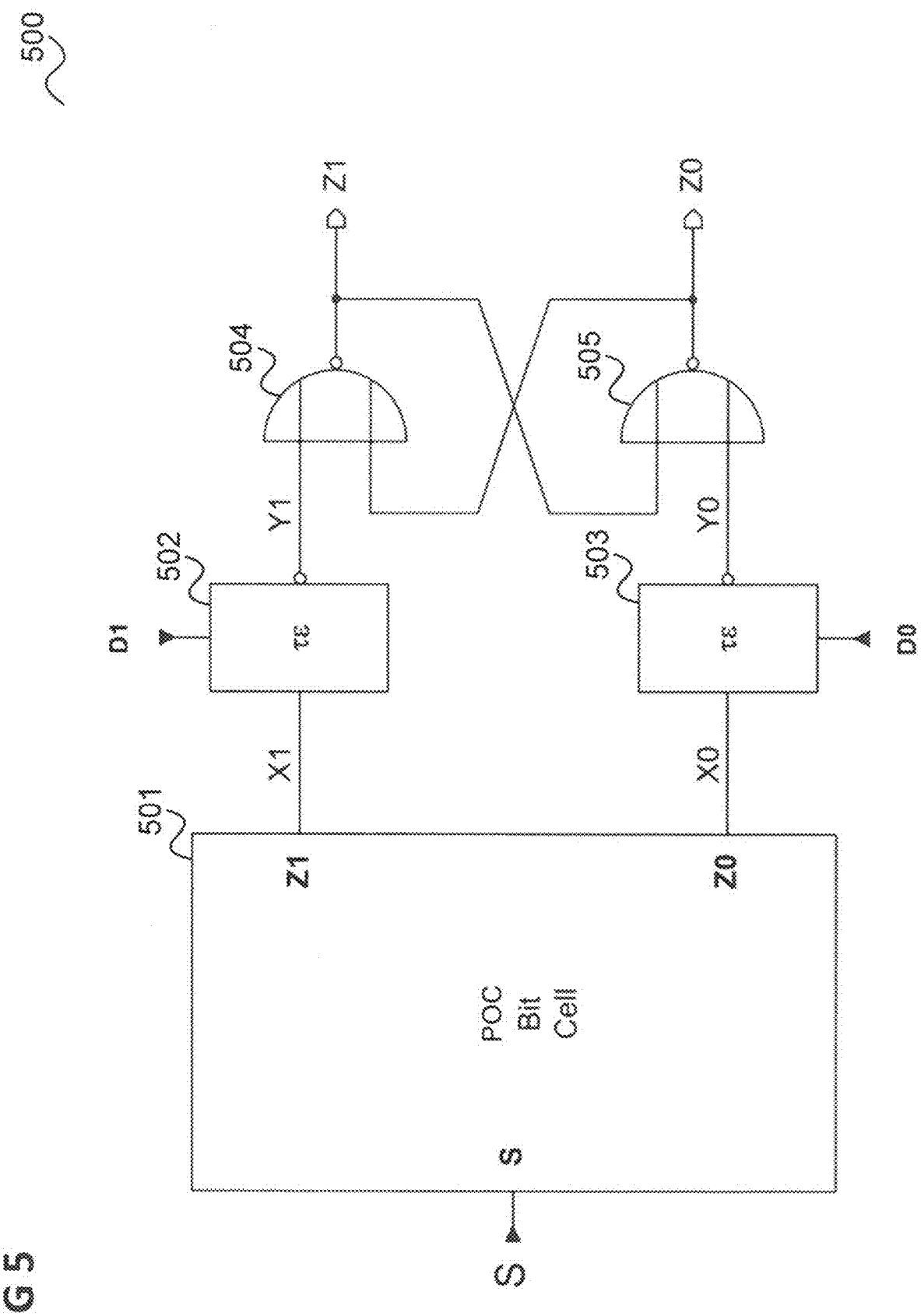
FIG. 5 shows a POC circuit including a POC cell.

FIG. 5 shows a POC circuit 500.

The POC circuit 500 includes a POC cell 501, for example corresponding to the POC cell 300 of FIG. 3.

A switchable (and inverting) delay element 502, 503, referred to by $\tau\varepsilon$, is arranged in each output signal path between the outputs X1 (corresponding to output Z1 of TIE cell 501) and X0 (corresponding to output Z0 of TIE cell 501) of the POC cell 300 and an appropriate RS-Flip-Flop (RS-FF) serving for capturing the resulting POC bit. The delay elements can be seen as pre-selection circuitry for the RS-FF for capturing the POC bit value. The POC bit value that is captured, stored and output is either Z1=0 (and Z0=1) or Z1=1 (and Z0=0).

The RS-FF is in this example formed by a first NOR gate 504 and a second NOR gate 505. One input of the first NOR gate 504 is coupled to the output Y1 of the first delay element 502 and the other input of the first NOR gate 504 is coupled to the output of the second NOR gate 505. One input of the second NOR gate 505 is coupled to the output Y0 of the second delay element 503 and the other input of the second NOR gate 505 is coupled to the output of the first NOR gate 504.

The output of the first NOR gate 504 is a first output Z1 of the POC circuit 500 and the output of the second NOR gate 505 is a second output Z0 of the POC circuit 500.

The first delay element 502, i.e. the delay element of the X1 path, is controlled by a control signal D1 and the second delay element 503, i.e. the delay element of the X0 path, is controlled by a control signal D2.

For Dj=0, j=1, 0, the respective delay element is in a state of minimum delay $\tau(0)$, whereas for Dj=1, j=1, 0, the respective delay element is in a state of large delay $\tau(1) \gg \tau(0)$. It should be noted that this approach may be extended to more than two delay adjustment states by including more than two possible values for Dj.

The Dj may be set by a controller, e.g. by the POC module 106. The controller (or a further circuit, e.g. of the POC module 106) may also be supplied by the captured POC bit.

The controller may classify a POC bit as being "stable", if and only if for both (D1=1, D0=0) and (D1=0, D0=1) the same result is captured by the RS-FF, i.e. pre-selection means that the faster signal path must be at least by $\tau(1)-\tau(0)$ faster than the slower one to be classified as being a valid POC bit. Otherwise, the controller discards the POC bit, i.e. the corresponding POC Bit is marked invalid or irrelevant in the POC's enrollment phase, and is sorted out for and will not be considered in the POC evaluation/reconstruction phase.

In contrast with POC bit enrollment, during POC reconstruction for all valid POC bits the controller sets both delay elements to the same, e.g. minimum delay $\tau(0)$ by applying (D1=0, D0=0) in order to make proper use of the valid POC bit's high stability.

The start value 0 at the POC Bit Cell input S results in a 1 at the Y1 and Y0 inputs of the RS-FF, so that the RS-FF is set to its precharge value (Z1,Z0)=(0,0).

To evaluate the output (Z1,Z0) for a rising signal edge S->1, the RS-FF senses which of the two TIE cell delays within the POC Bit Cell is smaller: (Z1,Z0)=(1,0) if the signal, i.e. the falling edge, arriving at Y1 is faster, and (Z1,Z0)=(0,1) if the falling edge arriving at Y0 is faster. It should be noted that the signal arriving later does not change the value of (Z1,Z0) anymore since then Y1=Y0=0, i.e. the RS-FF switches to its "data storing" state.

An alternative way to realize stable-bit-marking or adjustable pre-selection of POC bits can be implemented by means of a counter that is started by the faster of the two TIE cell outputs Z1 and Z0, and which is stopped by the slower one. An POC bit value is then only accepted as valid (e.g. again by a corresponding controller, e.g. POC module 106) if the counter has reached a predefined (and even adjustable) value. Otherwise, the considered POC bit is marked as invalid since it is considered as not being stable enough.

In addition to that, another criterion for POC Bits that are accepted as valid can be implemented by requiring a maximum delay between the rising edge of S (i.e. the point in time when the POC Bit Cell is activated) and the rising edge of the faster POC Bit Cell outputs Z1 or Z0. That is, the POC Bit is only accepted as valid if the RS-FF can capture the faster POC Bit Cell outputs Z1 or Z0 within a predefined (and even adjustable) time interval that can also be controlled by the above mentioned bit counter.

The POC Bit Cell of FIG. 3 can be seen to compare two TIE cell deep sub-threshold relaxation times in order to generate one POC Bit.

According to one embodiment, this is generalized to circuitry that allows for comparison of more than two TIE cell deep sub-threshold relaxation times. This is illustrated in FIG. 6.

Figure 6:
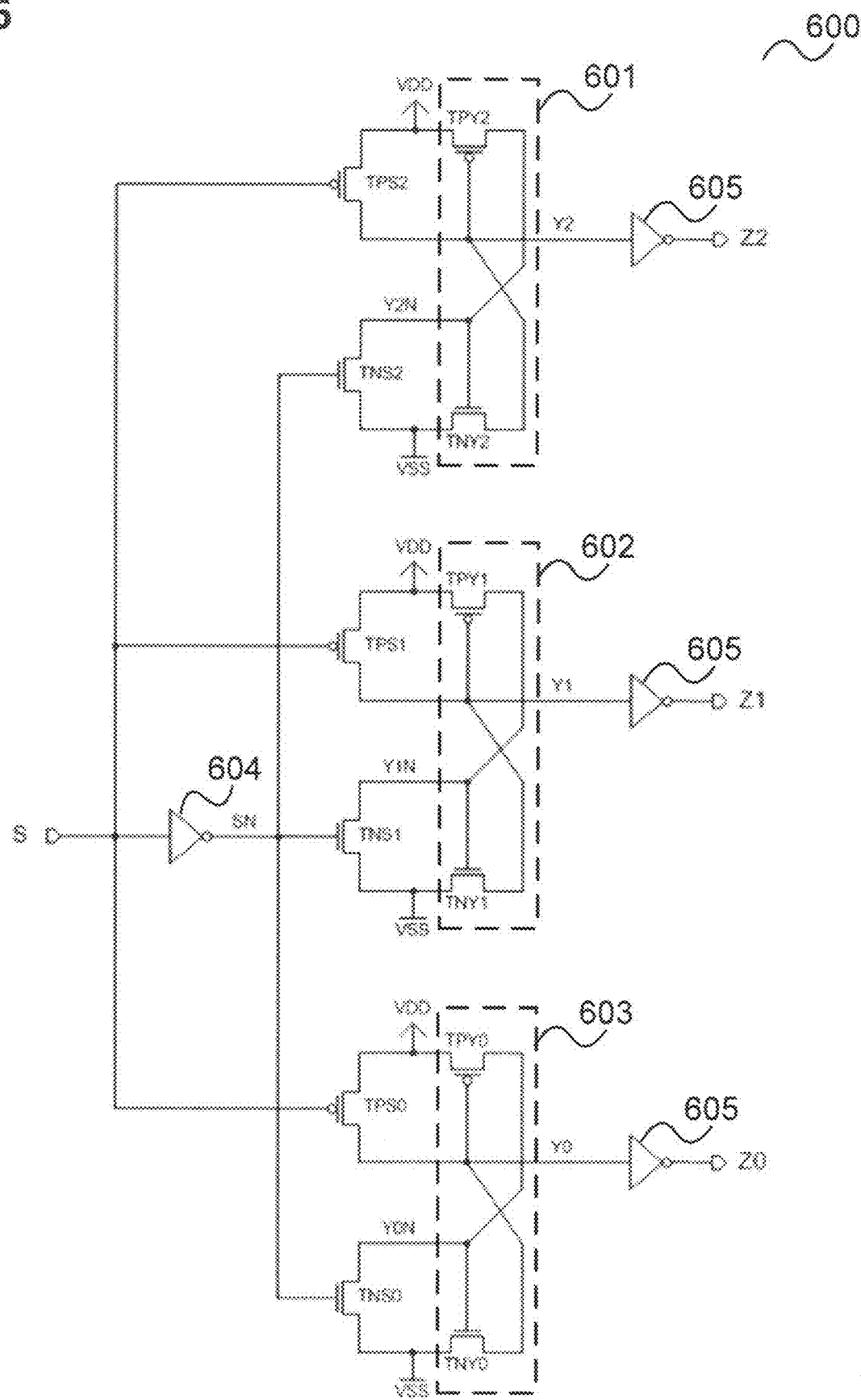
FIG. 6 shows a POC cell having three TIE cells.

FIG. 6 shows a POC (bit) cell 600.

The POC cell 600 includes three TIE cells 601, 602, 603, which are like the TIE cells 312, 313 of FIG. 3 provided with precharge circuitry including an input inverter 604 and each provided with a respective output inverter 605.

The POC cell 600 thus allows for pairwise comparison of three TIE cell deep sub-threshold relaxation times, so that the TIE cell outputs may be configured to perform all three possible comparisons of the delays of the three outputs Z2, Z1 and Z0, thus representing up to three POC bits, two of which can in general be considered independent. The six possible combinations of the values of the three POC bits are given by which of the three outputs switches to One first (three possibilities), times which of the remaining two outputs switches to One second (two possibilities).

A possible generalization of this principle consists in comparing all $n*(n-1)/2$ outputs Zn-1, Zn-2, . . . , Z0 of a POC Bit Cell including n TIE cells.

Yet another variant of the POC bit generation principle illustrated by FIG. 3 and FIG. 6 consists in POC bit cells that contain TIE cells with different in-built relaxation times due to systematically different transconductances of the involved (CMOS elements) (i.e. the FETs), for instance due to different MOS threshold voltages. If for instance the FETs 301, 302 of the first TIE cell 312 of FIG. 3 are implemented with a lower threshold voltage than the FETs 307, 308 of the second TIE cell, then (Y1,Y1N) will relax systematically much faster than (Y0,Y0N) in all implemented instances. Since, however, all instances of the same cell look identical with respect to their geometrical design but some may possibly differ (or not) in the threshold voltages of their TIE cell components, this opens up the option to conceal mixtures of true random POC Bits with predetermined i.e. predictable outputs.

In the following, various variations of the POC generation principle explained with reference to FIG. 3 are described. All of these variants can also be generalized in the same way as described above (in context of the POC cell 200 of FIG. 3).

Figure 7:
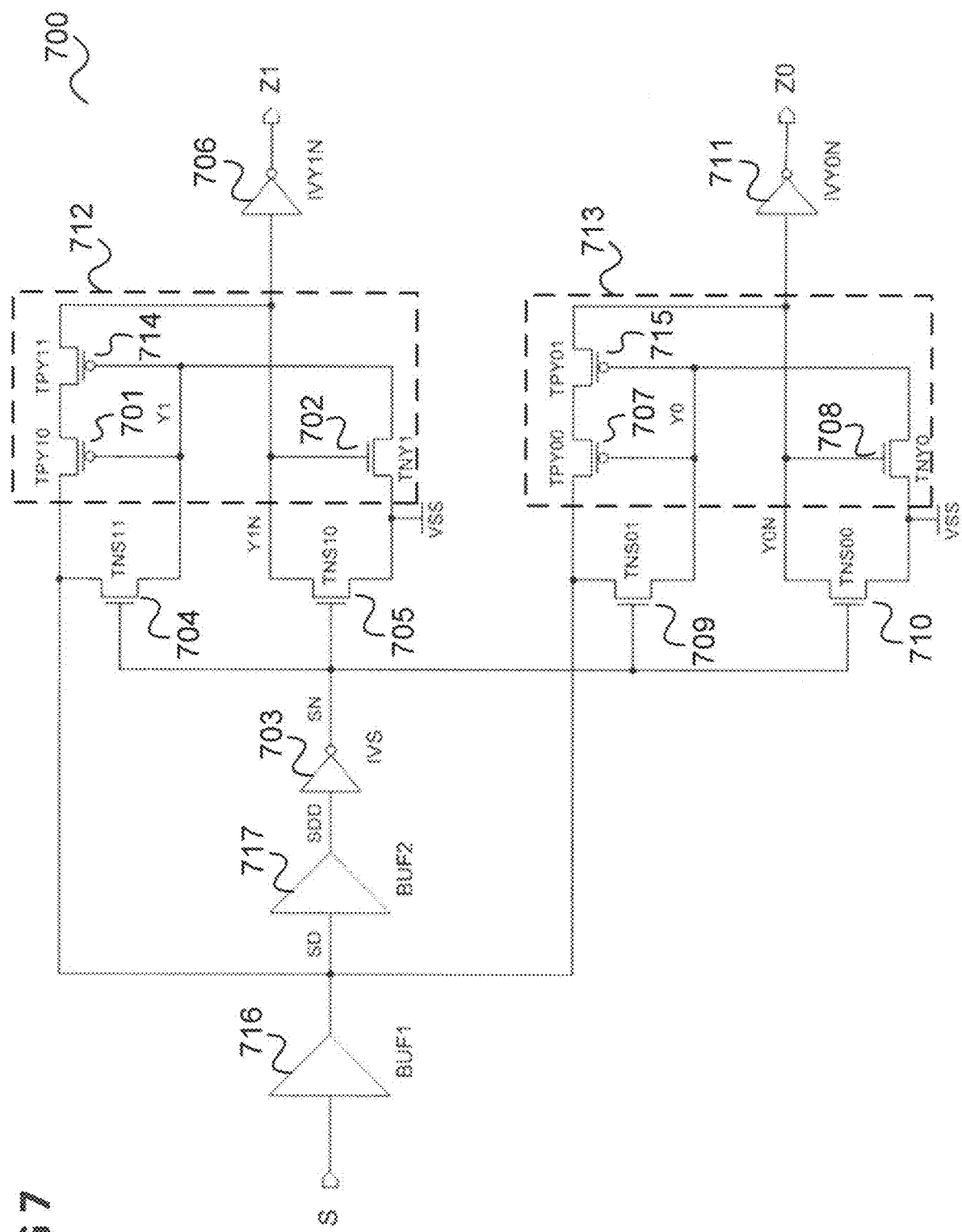
FIG. 7 shows a POC cell having two TIE cells of another variant.

FIG. 7 shows a POC cell 700.

Similarly to the POC cell 300 of FIG. 3, the POC cell 700 includes a first TIE cell 712 and a second TIE cell 713 which are formed similarly to the TIE cells 312, 313 with the difference that instead of a single p-channel FET 301, 302 (per TIE cell 312, 313), the TIE cells 712, 713 each include a serial connection of two p-channel FETs 701, 714 and 707, 715. Otherwise, similarly to the POC cell 300, the TIE cells 712, 713 each include an n-channel FET 702, 708, are provided with precharge circuitry and an input inverter 703 and are each provided with an output inverter 706, 711. However, in contrast to the POC cell 300, the precharge circuitry is formed by only n-channel FETs 704, 705, 709, 710 (i.e. p-channel FETs 304, 305 are replaced by n-channel FETs). Further, a first buffer 716 and a second buffer 717 are arranged in series between the input S and the input inverter 703. The output of the first buffer 716 (which is connected to the input of the second buffer 717) is connected to the series of p-channel FETs 701, 714 of the first TIE cell (specifically to the source of the first FET 701 in the series) and to the series of p-channel FETs 707, 715 of the second TIE cell (specifically to the source of the first FET 707 in the series). A further (minor) difference with respect to the POC cell 300 of FIG. 3 is that the inputs of the output inverters 706 and 711 are connected to the gates of the n-channel FETs 702, 708 rather than to the gates of the p-channel FETs 701, 714, 707, 715.

Figure 8:
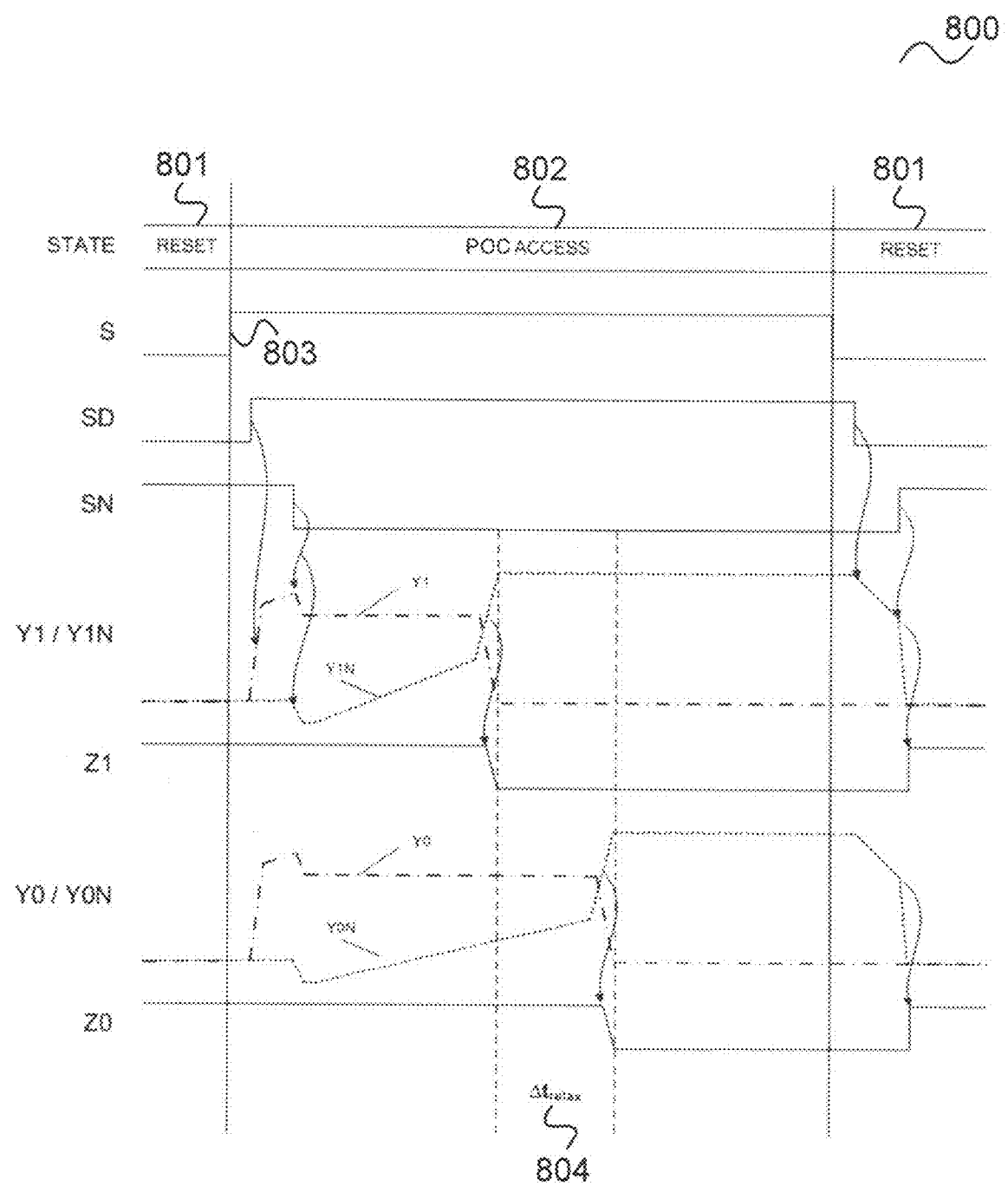
FIG. 8 shows a timing diagram for the POC cell of FIG. 7.

FIG. 8 shows a timing diagram 800 for the POC cell 700 of FIG. 7.

Similarly to FIG. 4, the signals S, Y1, Y1N, Y0, Y0N, Z1, Z0 are shown over time from left to right. In addition, the signals SD (output of first buffer 716) and SN (output of input inverter 703) are shown. As in FIG. 4, the signals are shown for reset states 801 and a POC access state 802.

The buffers 716, 717 together with the input inverter 703 and the n-channel FETs 704, 705, 709, 710 form circuitry for enforcing and releasing the non-equilibrium initial condition.

If the control input S is set to 0 (i.e. to VSS level, e.g. by a corresponding controller, e.g. POC module 106) the initial TIE cell constraints
V(Y1)=VSS, V(Y1N)=VSS,
V(Y0)=VSS, V(Y0N)=VSS, are now enforced since then the TIE cells' upper supply voltage (VDD in FIG. 3) is replaced by SD=0, and all precharge transistors 704, 705, 709, 710 for the TIE cell nodes Y1, Y1N and Y0, Y0N are in their respective ON states (strong inversion).

This reset state 801 is indicated in FIG. 8 as the initial state, before control input S is set to 1, whereby the POC access is initiated. After that, the POC access signal S is reset to 0, whereby the circuit 800 enters again its reset state.

POC access is initiated with the rising edge 803 of S (S=0->1), whereby first of all SD, which is the upper supply of the TIE cells 712, 713 switches to 1 (i.e. VDD level) so that nodes Y1 and Y0 are pulled up via the n-channel FETs 704, 709 to voltage levels of approximately VDD-Vth(FET 704) and VDD-Vth(FET 709), respectively. Shortly afterwards SN switches to 0 and disables the precharge transistors 704, 705, 709, 710 for the TIE cell nodes Y1, Y1N and Y0, Y0N, whereby the latter's node voltages drop a little by a difference ΔVcc and a difference ΔVcc', respectively, due to capacitive coupling from SN.

Then, the relaxation of node pairs Y1, Y1N and Y0, Y0N takes place, however, compared to that described with FIG. 4, with different initial conditions: Y1 and Y0 no longer start from VDD but from VDD-Vth(FET 704)-ΔVcc and VDD-Vth(FET 709)-ΔVcc, respectively, and Y1N and Y0N start from VSS-ΔVcc' instead of VSS. This results first of all in generally smaller relaxation times (since FETs 701, 714 and FETs 707, 715 start in a comparatively less deep sub-threshold state).

Moreover and more importantly, there is also realized a negative feedback with respect to temperature variations: since Vth(FET 704) and Vth(FET 709) rise with falling temperature, the start values of the voltages at nodes Y1 and Y0 decrease with lower temperatures thereby increasing the relaxation speed and counteracting the decrease in relaxation speed due to higher threshold voltages of FETs 701, 714, 702 and 707, 715, 708.

The extremely non-linear relaxation from the deep sub-threshold non-equilibrium state of nodes Y1, Y1N and Y0, Y0N after the constraints have been released with S=1 (i.e. during the POC access phase 802) is indicated in FIG. 8.

Due to manufacturing variations of the relevant transistors 701, 714, 702 (of first TIE cell 712), as well as transistors 707, 715 and 708 (of second TIE cell 713) the electrothermal relaxations of Y1, Y1N and Y0, Y0N differ usually significantly in their relaxation times (being in the order of some ns up to several 10 ns). As a consequence, the output signals Z1 and Z0 switch to 1 at different times which is indicated by a time difference 804, denoted as $\Delta_{trelax}$, in FIG. 8.

Figure 9:
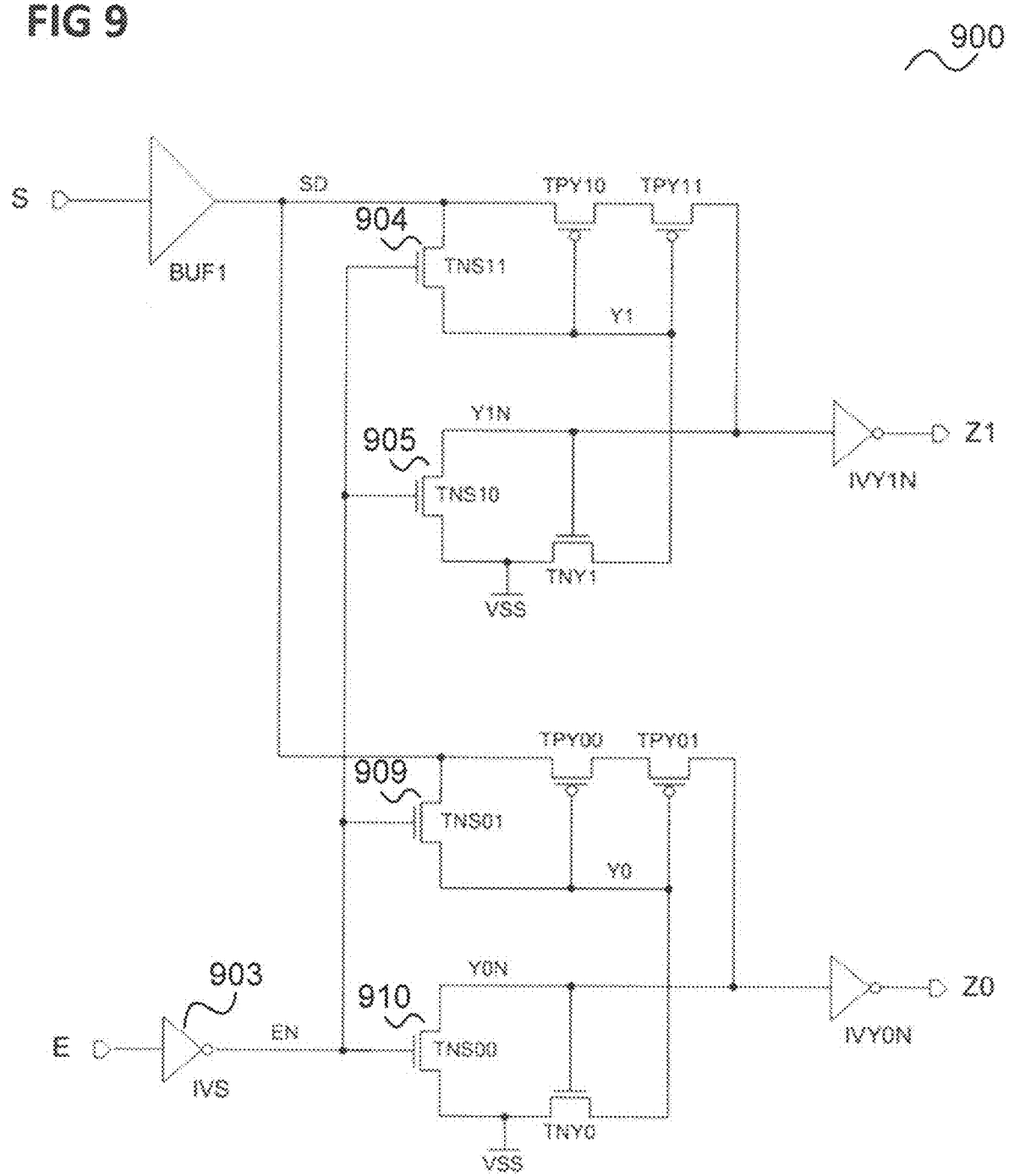
FIG. 9 shows another POC cell which can be seen as a variant of the POC cell 700 of FIG. 7.

FIG. 9 shows another POC cell 900, which can be seen as a variant of the POC cell 700 of FIG. 7.

The POC cell 900 differs from the POC cell 700 in that the input inverter 903 does not receive its input signal via a second buffer 717 but receives an enable signal E (and thus generates a signal EN instead of SN).

Thus, the only difference to FIG. 7 is the decoupling of the timings of S and SN allowing for an adjustable start level of the voltages of nodes Y1 and Y0 by introducing a second input control signal E that is inverted to EN and controls the disabling of the precharge transistors 904, 905, 909, 910 for the TIE cell nodes Y1, Y1N and Y0, Y0N. Thus, variable timings for the rising edges of S and E allows for more or less time for pulling up Y1 and Y0 after the rising edge of S and before the rising edge of E.

Figure 10:
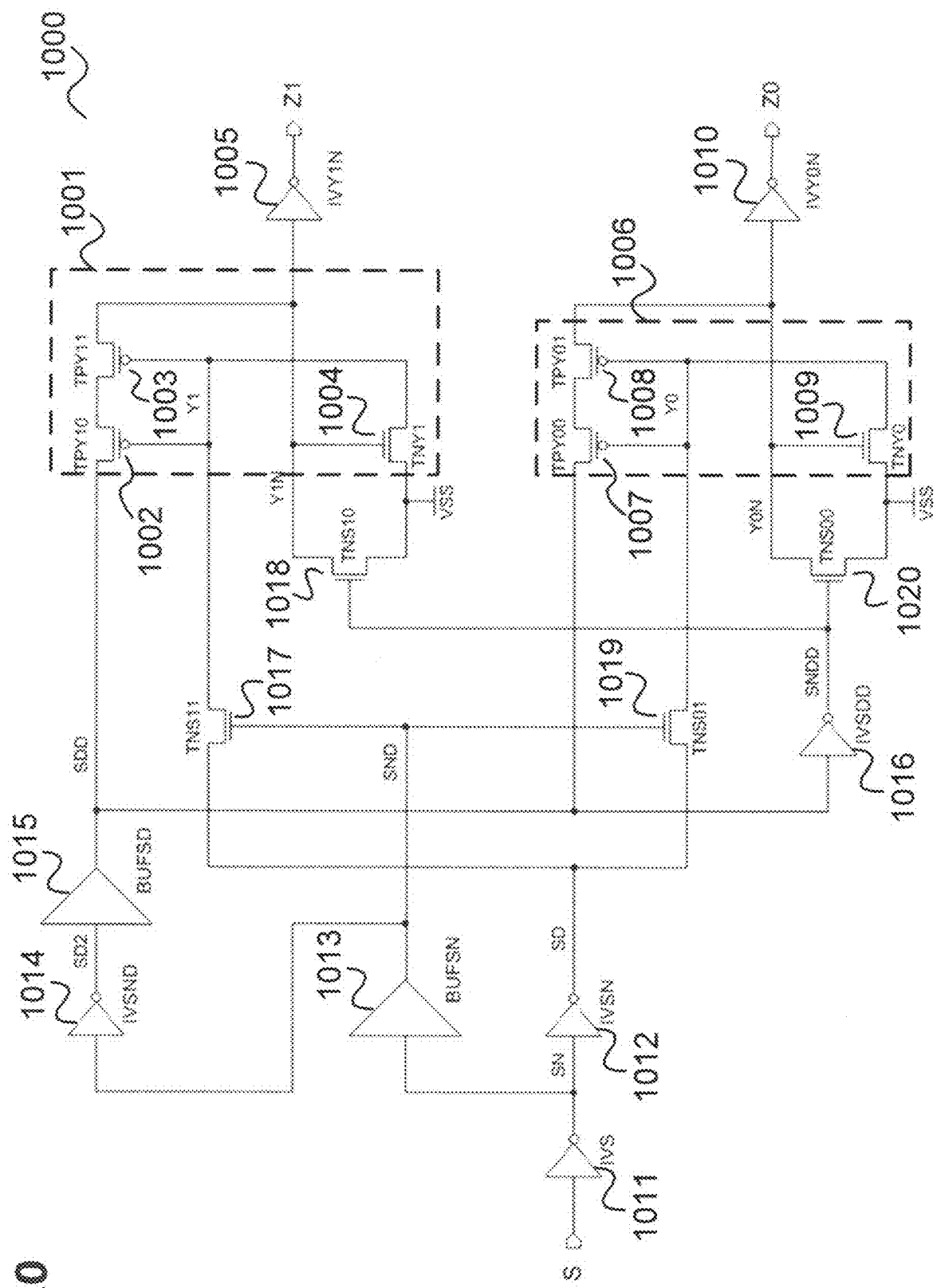
FIG. 10 shows a POC cell according to another example.

FIG. 10 shows a POC cell 1000 according to another example.

Similarly to the POC cell 700 of FIG. 7, the POC cell 1000 includes a first TIE cell 1001 formed by a first p-channel FET 1002 and a second p-channel FET 1003 in series and a first n-channel FET 1004 and provided with a first output inverter 1005 and a second TIE cell 1006 formed by a third p-channel FET 1007 and a fourth p-channel FET 1008 in series and a second n-channel FET 1009.

Moreover, there is also circuitry for enforcing and releasing the non-equilibrium initial condition including a first input inverter 1011 with input S and output SN, a second input inverter 1012 with input SN and output SD, a first buffer 1013 with input SN and output SND, a third input inverter 1014 with input SND and output SD2, a second buffer 1015 with input SD2 and output SDD, a fourth inverter 1016 with input SDD and output SNDD, as well as (only nMOS) precharge transistors 1017 to 1020 for the TIE cell nodes Y1, Y1N and Y0, Y0N, respectively (which are denoted as in FIG. 3).

Specifically, the first precharge n-channel FET 1017 is supplied with SND at its gate and SD at its source and is coupled to Y1 with its drain, the second precharge n-channel FET 1018 is supplied with SNDD at its gate and VSS at its source and is coupled to Y1N with its drain, the third precharge n-channel FET 1019 is supplied with SND at its gate and SD at its source and is coupled to Y0 with its drain and the fourth precharge n-channel FET 1020 is supplied with SNDD at its gate and VSS at its source and is coupled to Y0N with its drain.

Figure 11:
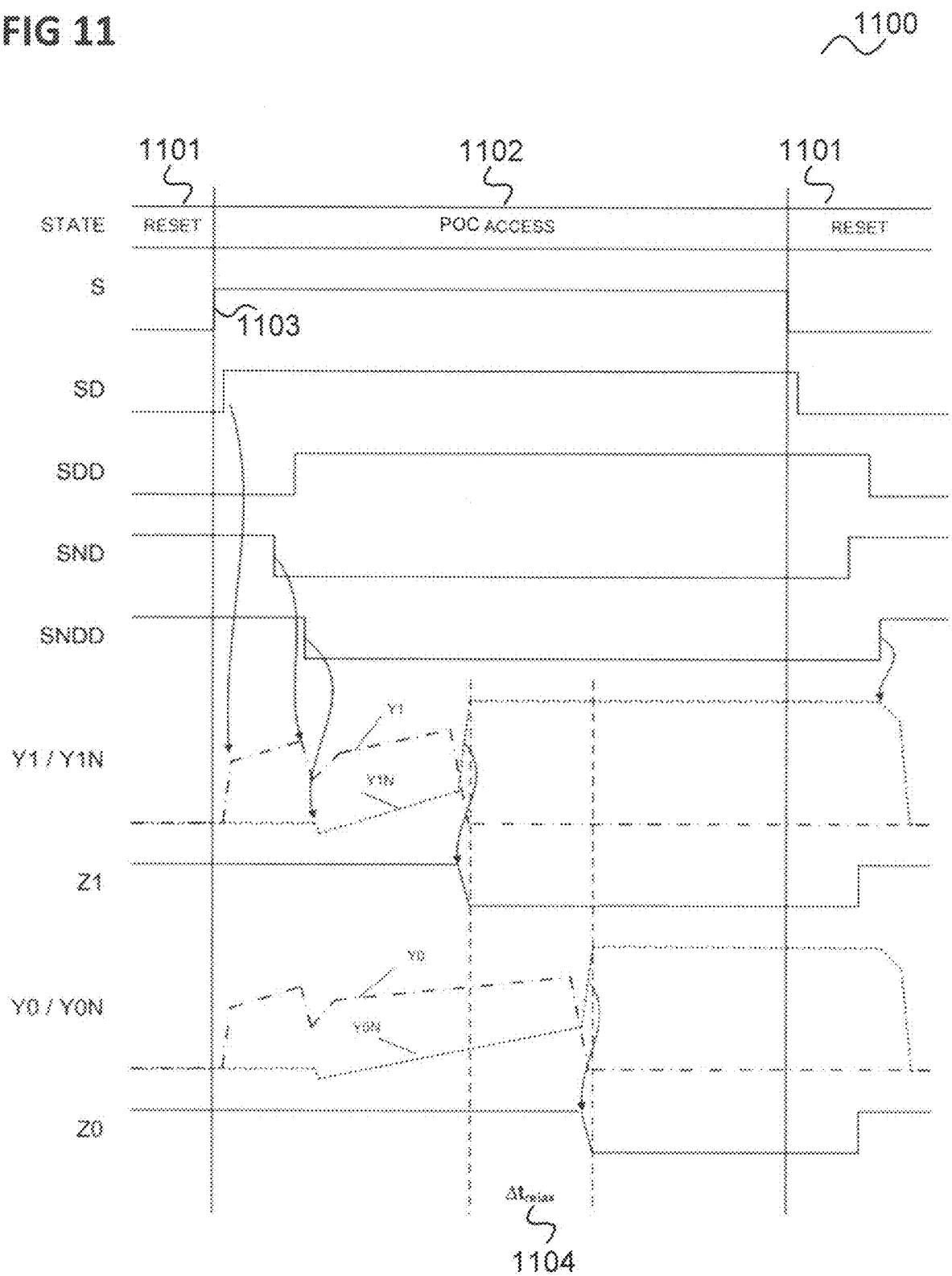
FIG. 11 shows a timing diagram for the POC cell of FIG. 10.

FIG. 11 shows a timing diagram 1100 for the POC cell 1000 of FIG. 10.

Similarly to FIGS. 4 and 8, the signals S, SD, SDD, SND, SNDD, Y1, Y1N, Z1, Y0, Y0N, and Z0 are shown over time from left to right. As in FIGS. 4 and 8, the signals are shown for reset states 1101 and a POC access state 1102.

If the control input S is set to 0 (i.e. to VSS level, e.g. by a corresponding controller, e.g. POC module 106) the initial TIE cell constraints
V(Y1)=VSS, V(Y1N)=VSS,
V(Y0)=VSS, V(Y0N)=VSS,
are enforced since then the TIE cells' upper supply voltage (VDD in FIG. 3) is replaced by SDD=0, and all precharge FETs 1017, 1018, 1019 and 1020 for the TIE cell nodes Y1, Y1N and Y0, Y0N are in their respective ON states (strong inversion).

This reset state is indicated in FIG. 11 as the initial state, before control input S is set to 1, whereby the POC access is initiated. After that, the POC access signal S is reset to 0, whereby the circuit enters again its reset state.

POC access is initiated with the rising edge 1103 of S (S=0->1), whereby first of all SD, the precharge value for nodes Y1 and Y0 switches to 1 (i.e. VDD level) thereby pulling up nodes Y1 and Y0 via the first precharge FET 1017 and the third precharge FET 1019 to voltage levels of approximately VDD-Vth (FET 1017) and VDD-Vth (FET 1019), respectively, since signal SND, controlling the gates of these precharge FETs 1017, 1019, remains at VDD level for a short time interval due to the first delay buffer 1013. Then, SND switches to 0 and disables the precharge FETs 1017, 1019 for the TIE cell nodes Y1 and Y0, whereby the latter's node voltages drop a little by $\Delta$Vcc due to capacitive coupling from SND. Finally, SNDD switches to 0 and disables the second precharge FET 1018 and the fourth precharge FET 1019 for nodes Y1N and Y0N, whereby the latter's node voltages drop a little by $\Delta$Vcc' due to capacitive coupling from SNDD.

Then, the relaxation of node pairs Y1, Y1N and Y0, Y0N takes place, however, compared to that in FIG. 4, with different initial conditions: Y1 and Y0 no longer start from VDD but from VDD-Vth(FET 1017)-$\Delta$Vcc and VDD-Vth (FET 1019)-$\Delta$Vcc, respectively, and Y1N and Y0N start from VSS-$\Delta$Vcc' instead of VSS. This results first of all in generally smaller relaxation times (since the TIE cells' p-channel FETs 1002, 1003, 1007, 1008 start in a comparatively less deep sub-threshold state).

Moreover and more importantly, there is also realized a negative feedback with respect to temperature variations: since Vth(FET 1017) and Vth(FET 1019) rise with falling temperature, the start values of the voltages at nodes Y1 and Y0 decrease with lower temperatures thereby increasing the relaxation speed and counteracting the decrease in relaxation speed due to higher threshold voltages of the TIE cells' FETs 1002, 1003, 1004, 1007, 1008, 1009.

The extremely non-linear relaxation from the deep sub-threshold non-equilibrium state of nodes Y1, Y1N and Y0, Y0N after the constraints have been released with S=1 (i.e. during the POC access phase 1102) is indicated in FIG. 11.

Due to manufacturing variations of the relevant transistors 1002, 1003, 1004 (first TIE cell 1001), as well as transistors 1007, 1008, 1009 (second TIE cell 1002) the electro-thermal relaxations of Y1, Y1N and Y0, Y0N differ usually significantly in their relaxation times (being in the order of some ns up to several 10 ns). As a consequence, the output signals Z1 and Z0 switch to 1 at different times which is indicated by a time difference 1104, denoted as $\Delta_{trelax}$, in FIG. 11.

Figure 12:
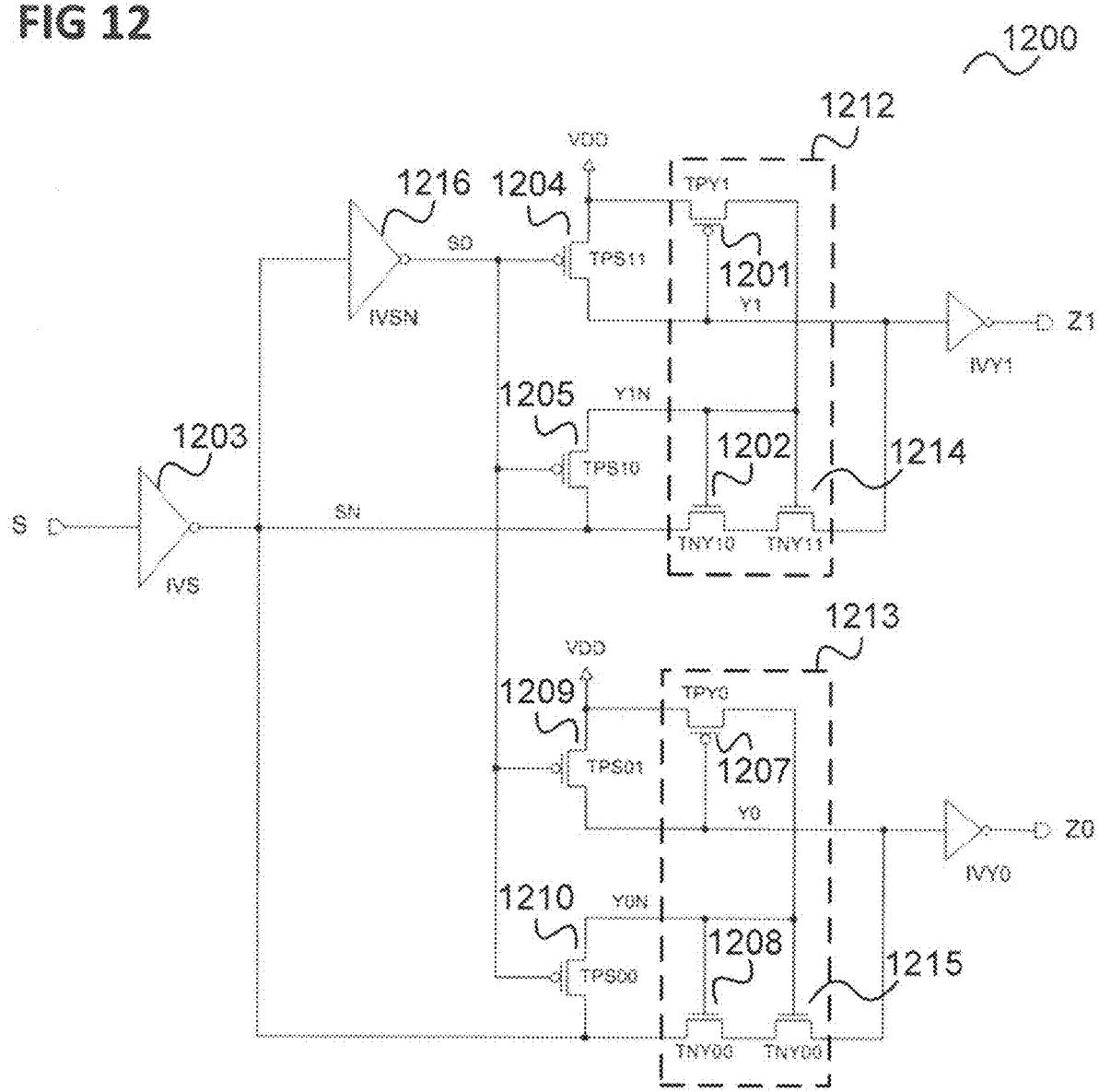
FIG. 12 shows POC cell that can be as the CMOS complement of the POC cell of FIG. 7.

FIG. 12 shows POC cell 1200 that can be seen as the CMOS complement of the POC cell 700 of FIG. 7.

This means that the TIE cells 1212, 1213 are each formed by a p-channel FET 1201, 1207 and a serial connection of n-channel FETs 1202, 1214, 1208, 1215 (instead of the other way round as in FIG. 7) and the precharge FETs 1204, 1205, 1209, 1210 are p-channel FETs (instead of n-channel FETs).

The POC cell 1200 further differs from the POC cell 700 in that there is a first input inverter 1203 which receives the input signal S and outputs SN to the source of the second precharge FET 1205 and the fourth precharge FET 1210 and a second input inverter 1216 which receives SN, inverts it to SD and supplies SD to the gates of the precharge FETs 1204-1210.

The input inverters 1203, 1216 and the precharge FETs 1204, 1205 (for Y1 and Y1N) and 1209, 1210 (for Y0 and Y0N) form the circuitry for enforcing and releasing the non-equilibrium initial condition.

Figure 13:
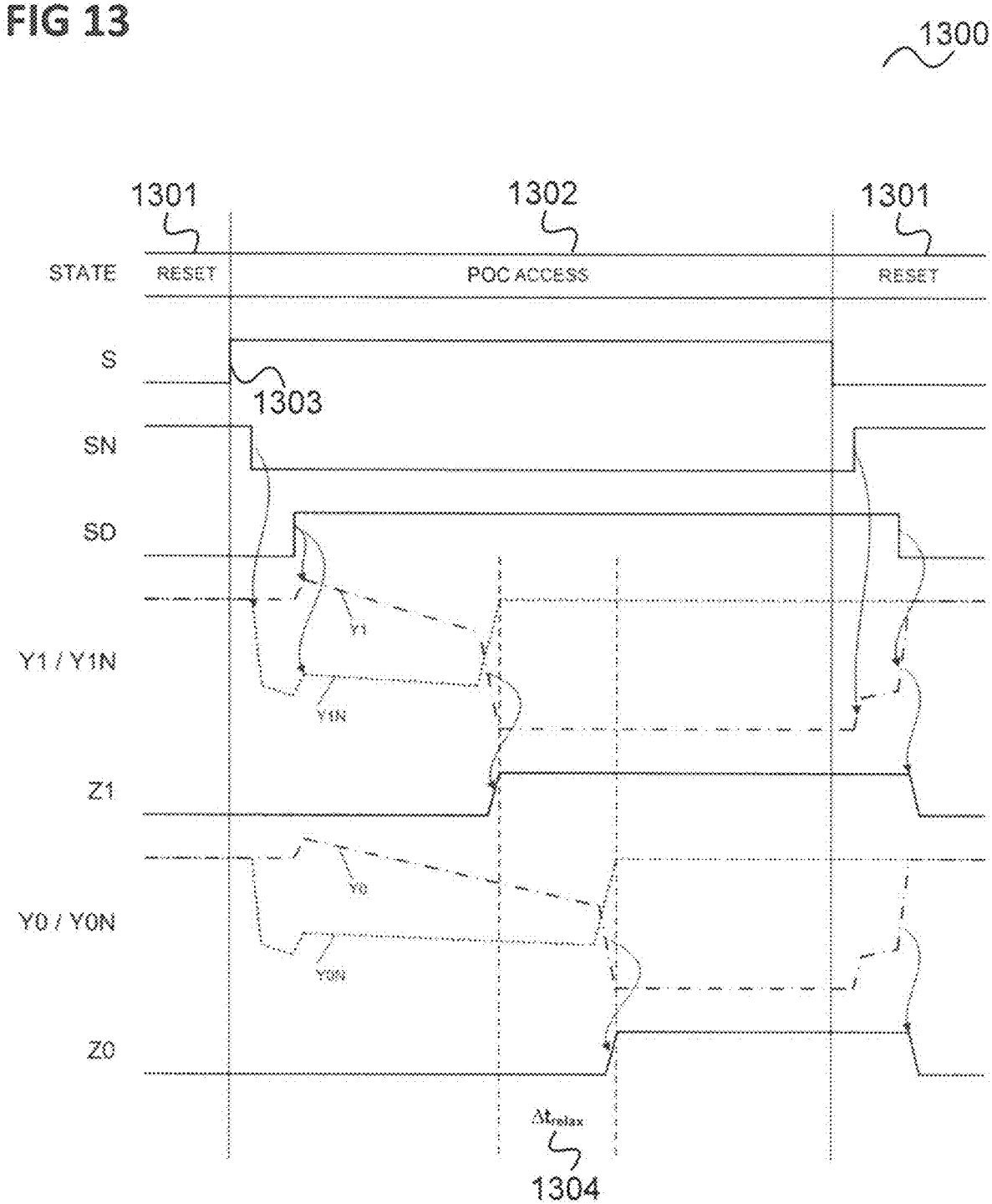
FIG. 13 shows a timing diagram for the POC cell of FIG. 12.

FIG. 13 shows a timing diagram 1300 for the POC cell 1200 of FIG. 12.

Similarly to FIGS. 4, 8 and 11, the signals S, SN, SD, Y1, Y1N, Z1, Y0, Y0N, and Z0 are shown over time from left to right. As in FIGS. 4, 8 and 11, the signals are shown for reset states 1301 and a POC access state 1302.

If the control input S is set to 0 (i.e. to VSS level), e.g. by a corresponding controller, e.g. POC module 106) the initial TIE cell constraints
V(Y1)=VDD, V(Y1N)=VDD,
V(Y0)=VDD, V(Y0N)=VDD,
are enforced since then the TIE cells' lower supply voltage (VSS in FIG. 3) is replaced by SN=1, and all precharge FETs 1204, 1205, 1209, 1210 for the TIE cell nodes Y1, Y1N and Y0, Y0N are in their respective ON states (strong inversion).

This reset state is indicated in FIG. 13 as the initial state, before control input S is set to 1, whereby the POC access is initiated. After that the POC access signal S is reset to 0, whereby the circuit enters again its reset state.

POC access is initiated with the rising edge 1303 of S (S=0->1 of S), whereby first of all SN, the lower supply of the TIE cells 1212, 1213 switches to 0 (VSS level) so that nodes Y1N and Y0N are pulled down via the second precharge FET 1205 and the fourth precharge FET 1210 to voltage levels of approximately |Vth(FET 1205)| and |Vth (FET 1210)|, respectively.

Shortly afterwards SD switches to 1 and disables the precharge FETs 1204, 1205, 1209, 1210 for the TIE cell nodes Y1, Y1N and Y0, Y0N, whereby the latter's node voltages increases a little by $\Delta$Vcc and $\Delta$Vcc', respectively, due to capacitive coupling from SD.

Then, the relaxation of node pairs Y1, Y1N and Y0, Y0N takes place, however, compared to that described with FIG. 4, with different initial conditions: Y1N and Y0N no longer start from VSS but from |Vth(FET 1205)|+$\Delta$Vcc and |Vth (FET 1210)|+$\Delta$Vcc, respectively, and Y1 and Y0 start from VDD+$\Delta$Vcc' instead of VDD.

This results first of all in generally smaller relaxation times (since the TIE cells' n-channel FETs 1202, 1214, 1208, 1215 start in a comparatively less deep sub-threshold state).

Moreover and more importantly, there is also realized a negative feedback with respect to temperature variations: since |Vth(FET 1205)| and |Vth(FET 1210)| rise with falling temperature, the start values of the voltages at nodes Y1N and Y0N increase with lower temperatures thereby increasing the relaxation speed and counteracting the decrease in relaxation speed due to higher threshold voltages of the TIE cells' FETs 1201, 1202, 1214, 1207, 1208, 1215.

The extremely non-linear relaxation from the deep sub-threshold non-equilibrium state of nodes Y1, Y1N and Y0, Y0N after the constraints have been released with S=1 (i.e. during the POC access phase 1302) is indicated in FIG. 13.

Due to manufacturing variations of the relevant transistors 1201, 1202, 1204 (of first TIE cell 1212), as well as transistors 1207, 1208, 1215 (of second TIE cell 1213) the electro-thermal relaxations of Y1, Y1N and Y0, Y0N differ usually significantly in their relaxation times (being in the order of some ns up to several 10 ns). As a consequence, the output signals Z1 and Z0 switch to 1 at different times which is indicated by a time difference 1304, denoted as $\Delta_{trelax}$, in FIG. 13.

Figure 14:
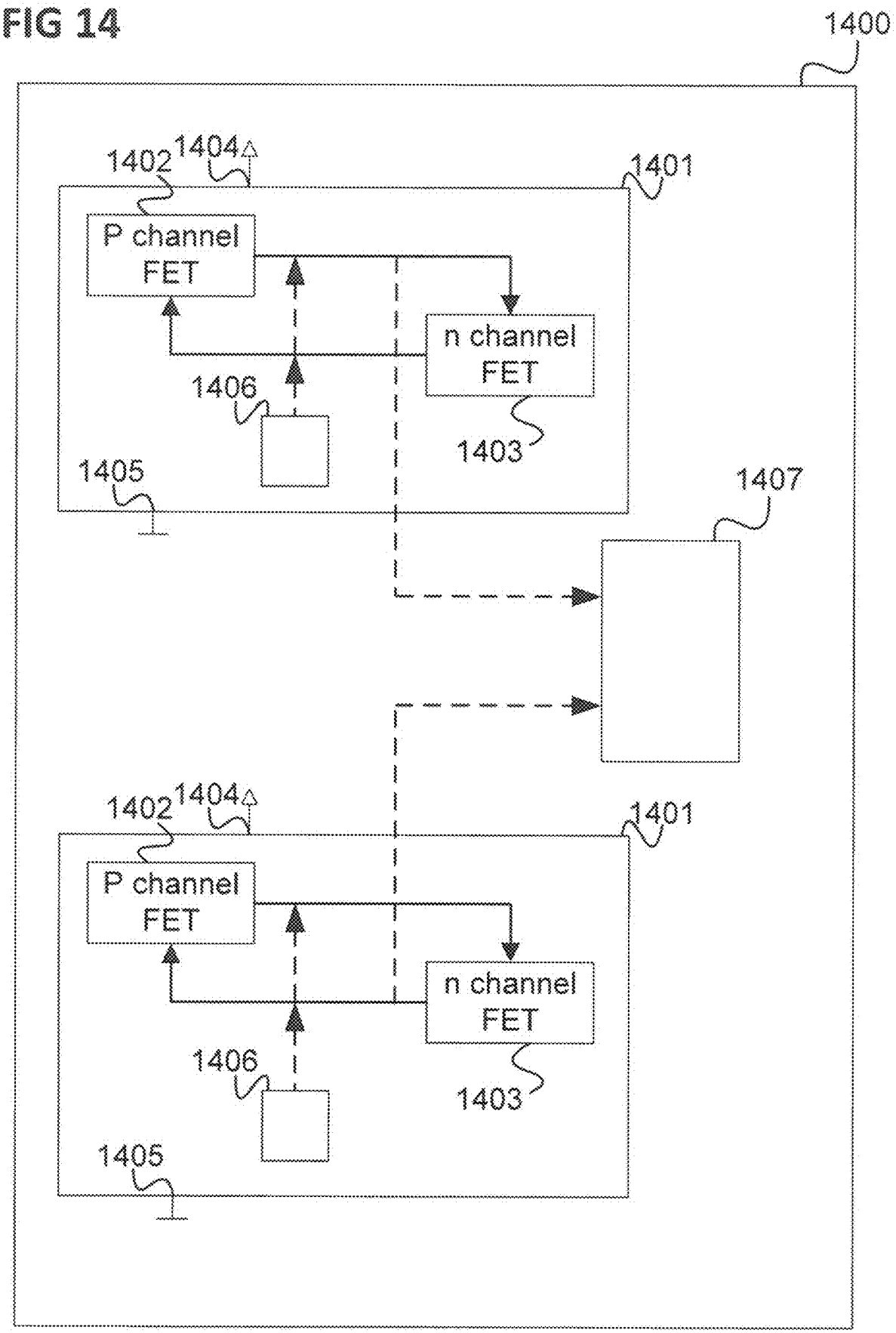
FIG. 14 shows a physically obfuscated circuit according to an embodiment.

In summary, according to various embodiments, a physically obfuscated circuit (POC) circuit is provided as illustrated in FIG. 14.

FIG. 14 shows a physically obfuscated circuit 1400 according to an embodiment.

The physically obfuscated circuit 1400 includes a plurality of subcircuits 1401, each subcircuit 1401 including at least one p-channel field effect transistor 1402, at least one n-channel field effect transistor 1403, a first power supply terminal 1404 configured to receive a first supply voltage with an upper supply potential and a second power supply terminal 1405 configured to receive a second supply voltage with a lower supply potential.

The at least one p-channel field effect transistor 1402 and the at least one n-channel field effect transistor 1403 are connected such that the at least one n-channel field effect transistor 1403, if supplied with the upper supply potential at its gate, supplies the lower supply potential to the gate of the at least one p-channel field effect transistor 1402 and the at least one p-channel field effect transistor 1402, if supplied with the lower supply potential at its gate, supplies the upper supply potential to the gate of the at least one n-channel field effect transistor 1403.

Each subcircuit 1401 further includes a precharge circuit 1406 configured to precharge the subcircuit to a first state in which the potential at the gate of the at least one n-channel field effect transistor 1403 is lower than the upper supply potential and the potential at the gate of the at least one p-channel field effect transistor 1402 is higher than the lower supply potential.

The physically obfuscated circuit 1400 further includes a physically obfuscated circuit value bit generation circuit 1407 configured to generate at least one physically obfuscated circuit value bit depending on which of the subcircuits 1401 first enters a second state in which the potential at the gate of the at least one n-channel field effect transistor 1403 is the upper supply potential and the potential at the gate of the at least one p-channel field effect transistor 1402 is the lower supply potential.

The physically obfuscated circuit (POC) circuit 1400 may for example correspond to the POC source 105 together with the POC module 106.

In other words, according to various embodiments, two (or more) TIE cells (denoted as "subcircuit" above) with each at least one p-channel FET and at least n-channel FET which hold each other in a steady state by turning each other on, are each precharged to an inverse state. The inverse state is inverse to the steady state in the sense that the FETs are turned off. A POC bit is generated based on which TIE cell reaches its steady state first. When there are more than two TIE cells, multiple POC bits may be generated by the POC bit generation circuit based on the order the TIE cells reach the steady state.

The first state may be a state when the FETs are turned off and the second state may be a state when the FETs are turned on. It should be noted that there may be a "relaxation state" between the first state and the second state i.e. a state which each subcircuit has when transitioning from the first state to the second state. The first state (possibly together with the relaxation state) may be seen as "non-equilibrium" state.

The relaxation state of a subcircuit for example starts when the precharge circuit finishes precharging the circuit, i.e. releases the subcircuit from the first state (which is enforced by the precharge). For example, in the first state the precharge circuit forces the subcircuit to be (and stay in the first state) and then "releases" the subcircuit to transition into its second state. The subcircuits can then be seen to "race" for the second state and the POC bit generation circuit generates one or more POC bits based on which subcircuit "wins the race" (or in case of more than two TIE cells, possibly on the order in which the TIE cells finish the respective relaxation).

Various Examples are described in the following:

Example 1 is a physically obfuscated circuit as illustrated in FIG. 14.

Example 2 is a physically obfuscated circuit according to Example 1, wherein the precharge circuit is configured to let the subcircuits start transitioning from the first state to the second state after precharging the subcircuits to the first state.

Example 3 is a physically obfuscated circuit according to Example 2, wherein the precharge circuit is configured to let the subcircuits start transitioning from the first state to the second state by means of supplying a common input signal to the subcircuits.

Example 4 is a physically obfuscated circuit according to any one of Examples 1 to 3, wherein the precharge circuit is configured to precharge the circuit to the first state in response to the reception of a request for a physically obfuscated circuit value.

Example 5 is a physically obfuscated circuit according to any one of Examples 1 to 4, wherein the second state is a steady state of the subcircuit and the first state is an inverse state of the second state.

Example 6 is a physically obfuscated circuit according to any one of Examples 1 to 5, wherein in the first state the potential at the gate of the at least one n-channel field effect transistor is the lower supply potential and the potential at the gate of the at least one p-channel field effect transistor is the higher supply potential.

Example 7 is a physically obfuscated circuit according to any one of Examples 1 to 6, wherein in the first state the potential at the gate of the at least one n-channel field effect transistor is a potential to turn off the n-channel field effect transistor and the potential at the gate of the at least one p-channel field effect transistor is a potential to turn off the p-channel field effect transistor.

Example 8 is a physically obfuscated circuit according to any one of Examples 1 to 7, wherein the physically obfuscated circuit value bit generation circuit is configured to receive, from each subcircuit, a signal indicating the state of the subcircuit.

Example 9 is a physically obfuscated circuit according to Example 8, wherein the physically obfuscated circuit value bit generation circuit includes a latch circuit supplied with the signal indicating the state of the subcircuit from each subcircuit and configured to be switched in a stable state depending on which of the subcircuits first enters the second state.

Example 10 is a physically obfuscated circuit according to any one of Examples 1 to 9, wherein the plurality of subcircuits includes three or more subcircuits and the physically obfuscated circuit value bit generation circuit is configured to generate a plurality of physically obfuscated circuit value bits depending on an order in which the subcircuits enter the second state.

Example 11 is a physically obfuscated circuit according to any one of Examples 1 to 10, wherein each subcircuit includes: a plurality of p-channel field effect transistors; wherein the p-channel field effect transistors and the at least one n-channel field effect transistor are connected such that the at least one n-channel field effect transistor, if supplied with a upper supply potential at its gate, supplies the lower supply potential to the gates of the p-channel field effect transistors; and the p-channel field effect transistors, if supplied with the lower supply potential at their gates, supply the upper supply potential to the gate of the at last one n-channel field effect transistor.

Example 12 is a physically obfuscated circuit according to any one of Examples 1 to 10, wherein each subcircuit includes: a plurality of n-channel field effect transistors; wherein the n-channel field effect transistors and the at least one p-channel field effect transistor are connected such that the at least one p-channel field effect transistor, if supplied with a lower supply potential at its gate, supplies the higher supply potential to the gates of the n-channel field effect transistors; and the n-channel field effect transistors, if supplied with the higher supply potential at their gates, supply the lower supply potential to the gate of the at last one p-channel field effect transistor.

Example 13 is a physically obfuscated circuit according to any one of Examples 1 to 10, wherein each subcircuit includes: a plurality of p-channel field effect transistors; a plurality of n-channel field effect transistors; wherein the p-channel field effect transistors and the n-channel field effect transistors are connected such that the n-channel field effect transistors, if supplied with a upper supply potential at their gates, supply the lower supply potential to the gates of the p-channel field effect transistors; and the p-channel field effect transistors, if supplied with the lower supply potential at their gates, supply the upper supply potential to the gates of the n-channel field effect transistors.

Example 14 is a physically obfuscated circuit according to Example 13, wherein the p-channel field effect transistors are connected in series and their gates are connected and the n-channel field effect transistors are connected in series and their gates are connected.

Example 15 is a physically obfuscated circuit according to any one of Examples 1 to 14, further including a key generator configured to generate a cryptographic key based on the physically obfuscated circuit value bit.

Example 16 is a physically obfuscated circuit according to any one of Examples 1 to 15, wherein in the first state the potential at the gate of the at least one n-channel field effect transistor depends on a field effect transistor threshold voltage of a field effect transistor of the precharge circuit.

Example 17 is a physically obfuscated circuit according to any one of Examples 1 to 16, Wherein in the first state the potential at the gate of the at least one p-channel field effect transistor depends on a field effect transistor threshold voltage of a field effect transistor of the precharge circuit.

Example 18 is a physically obfuscated circuit according to any one of Examples 1 to 17, wherein in the first state the potential at the gate of the at least one n-channel field effect transistor is the lower supply potential plus a field effect transistor threshold voltage of a field effect transistor of the precharge circuit.

Example 19 is a physically obfuscated circuit according to any one of Examples 1 to 18, wherein in the first state the potential at the gate of the at least one p-channel field effect transistor is the higher supply potential minus a field effect transistor threshold voltage of a field effect transistor of the precharge circuit.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

REFERENCE SIGNS

100 Chip card
101 Chip card carrier
102 Chip card module
103 Memory
104 CPU
105 POC source
106 POC module
200 TIE cell
201, 202 FETs
300 POC cell
301, 302 FETs
303 Inverter
304, 305 FETs
306 Inverter
307-310 FETs
311 Inverter
312, 313 TIE cells
400 Timing diagram
401 Reset states
402 POC access state
403 Time difference
404, 405 Time points
500 POC circuit
501 POC cell
502, 503 Delay elements
504, 505 NOR gates
600 POC cell
601-603 TIE cells
604, 605 Inverters
700 POC cell
701, 702 FETs
703 Inverter
704, 705 FETs
706 Inverter
707-710 FETs
711 Inverter
712, 713 TIE cells 714, 715 FETs
716, 717 Buffers
800 Timing diagram
801 Reset states
802 POC access state
803 Rising edge
804 Time difference
900 POC cell
903 Inverter
904-910 FETs
1000 POC cell
1001 TIE cell
1002-1004 FETs
1005 Inverter
1006 TIE cell
1007-1009 FETs
1010-1012 Inverters
1013 Buffer
1014 Inverter
1015 Buffer
1016 Inverter
1017-1020 FETs
1100 Timing diagram
1101 Reset states
1102 POC access state
1103 Rising edge
1104 Time difference
1200 POC cell
1201, 1202 FETs
1203 Inverter
1204, 1205 FETs
1207-1210 FETs
1212, 1213 TIE cells
1214, 1215 FETs
1216 Inverter
1300 Timing diagram
1301 Reset states
1302 POC access state
1303 Rising edge
1304 Time difference
1400 POC circuit
1401 Sub circuits
1402, 1403 FETs
1404, 1405 Supply terminals
1406 Precharge circuits
1407 POC bit generation circuit

What is claimed is:

1. A physically obfuscated circuit comprising:
a plurality of subcircuits, each subcircuit comprising
at least one p-channel field effect transistor;
at least one n-channel field effect transistor;
a first power supply terminal configured to receive a first supply voltage with an upper supply potential; and
a second power supply terminal configured to receive a second supply voltage with a lower supply potential;
wherein the at least one p-channel field effect transistor and the at least one n-channel field effect transistor are connected such that
the at least one n-channel field effect transistor, if supplied with the upper supply potential at its gate, supplies the lower supply potential to the gate of the at least one p-channel field effect transistor; and
the at least one p-channel field effect transistor, if supplied with the lower supply potential at its gate, supplies the upper supply potential to the gate of the at least one n-channel field effect transistor; and
a precharge circuit configured to precharge the subcircuit to a first state in which the potential at the gate of the at least one n-channel field effect transistor is lower than the upper supply potential and the potential at the gate of the at least one p-channel field effect transistor is higher than the lower supply potential; and
wherein the physically obfuscated circuit further comprises a physically obfuscated circuit value bit generation circuit configured to generate at least one physically obfuscated circuit value bit depending on which of the subcircuits first enters a second state in which the potential at the gate of the at least one n-channel field effect transistor is the upper supply potential and the potential at the gate of the at least one p-channel field effect transistor is the lower supply potential.

2. Physically obfuscated circuit according to claim 1, wherein the precharge circuit is configured to let the subcircuits start transitioning from the first state to the second state after precharging the subcircuits to the first state.

3. Physically obfuscated circuit according to claim 2, wherein the precharge circuit is configured to let the subcircuits start transitioning from the first state to the second state by means of supplying a common input signal to the subcircuits.

4. Physically obfuscated circuit according to claim 1, wherein the precharge circuit is configured to precharge the circuit to the first state in response to the reception of a request for a physically obfuscated circuit value.

5. Physically obfuscated circuit according to claim 1, wherein the second state is a steady state of the subcircuit and the first state is an inverse state of the second state.

6. Physically obfuscated circuit according to claim 1, wherein in the first state the potential at the gate of the at least one n-channel field effect transistor is the lower supply potential and the potential at the gate of the at least one p-channel field effect transistor is the higher supply potential.

7. Physically obfuscated circuit according to claim 1, wherein in the first state the potential at the gate of the at least one n-channel field effect transistor is a potential to turn off the n-channel field effect transistor and the potential at the gate of the at least one p-channel field effect transistor is a potential to turn off the p-channel field effect transistor.

8. Physically obfuscated circuit according to claim 1, wherein the physically obfuscated circuit value bit generation circuit is configured to receive, from each subcircuit, a signal indicating the state of the subcircuit.

9. Physically obfuscated circuit according to claim 8, wherein the physically obfuscated circuit value bit generation circuit comprises a latch circuit supplied with the signal indicating the state of the subcircuit from each subcircuit and configured to be switched in a stable state depending on which of the subcircuits first enters the second state.

10. Physically obfuscated circuit according to claim 1, wherein the plurality of subcircuits comprises three or more subcircuits and the physically obfuscated circuit value bit generation circuit is configured to generate a plurality of physically obfuscated circuit value bits depending on an order in which the subcircuits enter the second state.

11. Physically obfuscated circuit according to claim 1, wherein each subcircuit comprises:
a plurality of p-channel field effect transistors;
wherein the p-channel field effect transistors and the at least one n-channel field effect transistor are connected such that
the at least one n-channel field effect transistor, if supplied with a upper supply potential at its gate, supplies the lower supply potential to the gates of the p-channel field effect transistors; and
the p-channel field effect transistors, if supplied with the lower supply potential at their gates, supply the upper supply potential to the gate of the at last one n-channel field effect transistor.

12. Physically obfuscated circuit according to claim 1, wherein each subcircuit comprises:
a plurality of n-channel field effect transistors;
wherein the n-channel field effect transistors and the at least one p-channel field effect transistor are connected such that
the at least one p-channel field effect transistor, if supplied with a lower supply potential at its gate, supplies the higher supply potential to the gates of the n-channel field effect transistors; and
the n-channel field effect transistors, if supplied with the higher supply potential at their gates, supply the lower supply potential to the gate of the at last one p-channel field effect transistor.

13. Physically obfuscated circuit according to claim 1, wherein each subcircuit comprises:
a plurality of p-channel field effect transistors;
a plurality of n-channel field effect transistors;
wherein the p-channel field effect transistors and the n-channel field effect transistors are connected such that
the n-channel field effect transistors, if supplied with a upper supply potential at their gates, supply the lower supply potential to the gates of the p-channel field effect transistors; and
the p-channel field effect transistors, if supplied with the lower supply potential at their gates, supply the upper supply potential to the gates of the n-channel field effect transistors.

14. Physically obfuscated circuit according to claim 13, wherein the p-channel field effect transistors are connected in series and their gates are connected and the n-channel field effect transistors are connected in series and their gates are connected.

15. Physically obfuscated circuit according to claim 1, further comprising a key generator configured to generate a cryptographic key based on the physically obfuscated circuit value bit.

16. Physically obfuscated circuit according to claim 1, wherein in the first state the potential at the gate of the at least one n-channel field effect transistor depends on a field effect transistor threshold voltage of a field effect transistor of the precharge circuit.

17. Physically obfuscated circuit according to claim 1, wherein in the first state the potential at the gate of the at least one p-channel field effect transistor depends on a field effect transistor threshold voltage of a field effect transistor of the precharge circuit.

18. Physically obfuscated circuit according to claim 1, wherein in the first state the potential at the gate of the at least one n-channel field effect transistor is the lower supply potential plus a field effect transistor threshold voltage of a field effect transistor of the precharge circuit.

19. Physically obfuscated circuit according to claim 1, wherein in the first state the potential at the gate of the at least one p-channel field effect transistor is the higher supply potential minus a field effect transistor threshold voltage of a field effect transistor of the precharge circuit.

* * * * *